(12) United States Patent
Hana et al.

(10) Patent No.: US 8,149,145 B2
(45) Date of Patent: Apr. 3, 2012

(54) METHOD AND APPARATUS FOR ADAPTIVE LOSSLESS DATA COMPRESSION

(75) Inventors: Andrew Hana, Bristol (GB); Neil Thomas Hutchon, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 92 days.

(21) Appl. No.: 12/851,409

(22) Filed: Aug. 5, 2010

(65) Prior Publication Data

US 2012/0032823 A1    Feb. 9, 2012

(51) Int. Cl.
*H03M 7/30* (2006.01)
(52) U.S. Cl. ............................................. 341/51; 341/50
(58) Field of Classification Search .................... 341/50, 341/51, 106
See application file for complete search history.

(56) References Cited

U.S. PATENT DOCUMENTS

| | | | |
|---|---|---|---|
| 5,521,597 A * | 5/1996 | Dimitri | 341/51 |
| 5,525,982 A * | 6/1996 | Cheng et al. | 341/51 |
| 5,729,228 A * | 3/1998 | Franaszek et al. | 341/106 |
| 5,771,010 A | 6/1998 | Masenas | |
| 6,271,775 B1 | 8/2001 | Jaquette et al. | |
| 6,657,565 B2 | 12/2003 | Kampf | |
| 6,771,193 B2 | 8/2004 | Craft | |
| 7,051,126 B1 | 5/2006 | Franklin | |
| 7,180,433 B1 | 2/2007 | Grotmol | |
| 7,587,401 B2 | 9/2009 | Yeo et al. | |
| 2002/0056010 A1 | 5/2002 | Lincoln et al. | |
| 2002/0059463 A1 | 5/2002 | Goldstein | |
| 2004/0064588 A1 | 4/2004 | Jungck | |
| 2006/0193159 A1 * | 8/2006 | Tan et al. | 365/49 |
| 2008/0074142 A1 | 3/2008 | Henderson | |
| 2008/0148250 A1 * | 6/2008 | Motta | 717/170 |
| 2009/0288059 A1 | 11/2009 | Dimou et al. | |

* cited by examiner

*Primary Examiner* — Peguy Jean Pierre

(57) ABSTRACT

A method for performing adaptive lossless data compression using a buffer memory comprises the steps of receiving a plurality of first match signals (m(0) to m(n)), each first match signal indicating whether a byte of an input sequence matches a byte in a memory location of the buffer memory. A plurality of second match signals (mD(0) to mD(n)) are generated, wherein a second match signal (mD) is a delayed version of a corresponding first match signal (m). The second match signals (mD(0) to mD(n)) are used to detect a match sequence between the data bytes received in the input sequence and the data bytes stored in the content addressable memory, and the first match signals (m(0) to m(n)) used to predict whether the match sequence continues during a subsequent byte of the input sequence.

18 Claims, 19 Drawing Sheets

| Sequence 1<br>Sequence 2 | 100000 000000<br>010000 000000 | A two-byte sequence starting at location 0 |
|---|---|---|
| Sequence 1<br>Sequence 2 | 000000 001000 000000<br>010000 000100 000000 | A 3-byte sequence starting at location 1 |
| Sequence 1<br>Sequence 2 | 100000 001000 000010 000000<br>010000 000100 000001 000000 | This could be a 6-byte sequence starting at location 0, OR 3-byte sequence starting at location 0 followed by another 3-byte sequence starting at location 3! It's not possible to tell from the sequence registers on their own. Additional information is necessary! |

Figure 15

METHOD AND APPARATUS FOR ADAPTIVE LOSSLESS DATA COMPRESSION

BACKGROUND

Data compression is a technique that enables data to be coded in order to minimize the number of bits required to represent the original data.

Adaptive lossless data compression (ALDC) is a technique, as the name suggests, that enables the compression to be performed in a dynamic manner without any data being lost, thus enabling the original data to be regenerated to exactly its original state during a decompression operation.

An ALDC system typically uses a content addressable memory (CAM), which comprises a history buffer that stores a dictionary of data sequences. Incoming file strings to be compressed are adaptively matched against the data stored in the history buffer, such that the original data is represented by a succession of matches with the dictionary.

Existing CAM based ALDC compression engines require match signals (or flags) to be created at each history buffer location. The match signals are often combined logically, for example OR'd together, with the result being used to drive out a control signal to all locations of the history buffer.

This means that in one clock cycle there can be a large fan-in of signals to an OR gate, and a large fan-out of signals back to all history buffer locations in a cascade arrangement. For compression engines with relatively small history buffers this does not present any issues. However, for large compression engines the large fan-in and fan-out can be disadvantageous.

For example, if the size of a history buffer is increased, for example from 1024 to 16384 bytes (i.e. a 16 times increase), current technology does not allow for fan-in and fan-out to be achieved in one cycle for such a history buffer.

Another disadvantage with existing Cam based ALDC engines is that a delay can exist between the completion of the detection of one match sequence and the commencement of the detection of a new match sequence. This has the disadvantage of reducing the compression ratio.

BRIEF DESCRIPTION OF THE DRAWINGS

For a better understanding of the present invention, and to show more clearly how it may be carried into effect, reference will now be made, by way of example only, to the following drawings in which:

FIG. 6b illustrates the steps performed by the first implementation of FIG. 6a;

FIG. 15 shows an example of sequences used in the implementation of FIGS. 13a to 13d.

DETAILED DESCRIPTION

Figure 1:
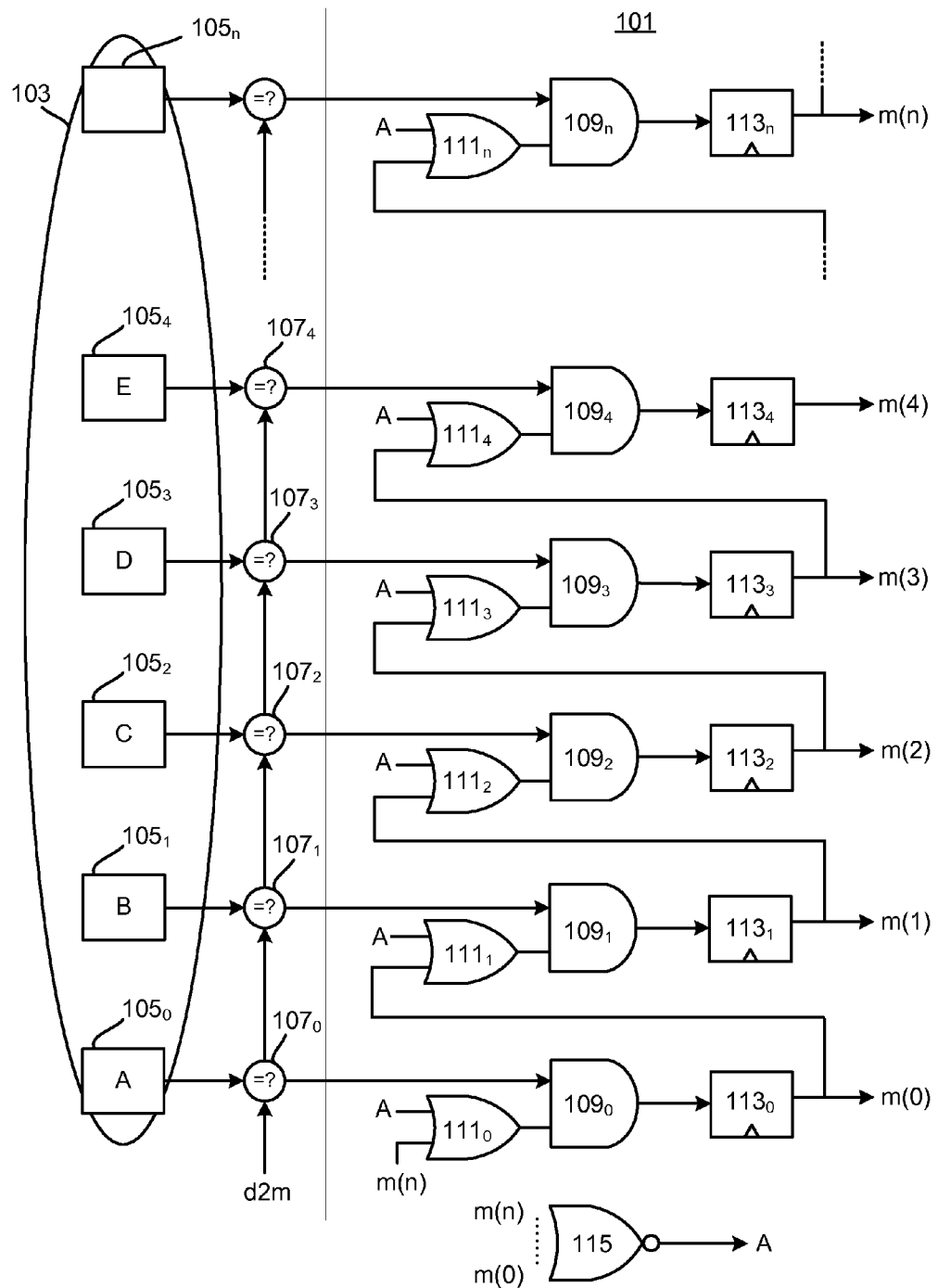
FIG. 1 illustrates an apparatus for use in adaptive lossless data compression using a content addressable memory.

The implementations described in the examples below provide a method and apparatus for use in adaptive lossless data compression (ALDC), for example ALDC used with a content addressable memory (CAM) having a history buffer. Although the various implementations are described in relation to a CAM having a history buffer, it is noted that the implementations may be used with any buffer memory having a set of storage locations that are capable of receiving data that is to be matched, and that are capable of generating corresponding match flags.

A content addressable memory comprises a history buffer that stores a plurality of bytes, with incoming sequences being compared with those bytes which are stored in the history buffer.

Consider a history buffer of a content addressable memory that comprises the sequence shown in Table 1 below stored in locations 1 to 12:

TABLE 1

| | Location | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| Contents | A | B | C | D | E | F | G | B | C | D | K | L | M |

As a first example, consider that an input sequence comprising the sequence A B C D is compared with the contents of the history buffer of Table 1 (i.e. an input sequence comprising A (first), then B, then C, then D). Such a sequence would correctly match at locations 0, then 1, then 2 and finally 3. This matching sequence would result in a "copy pointer" starting at address 0 lasting 4 bytes.

As a second example, consider that a new input sequence B C D E is compared with the contents of the history buffer of Table 1. Such a sequence would match as follows:

The in-coming B matches at location 1 and at location 7. Because no match sequence is currently in progress, both matches are maintained.

The in-coming C continues both sequences at locations 2 and 8.

The in-coming D continues both sequences at locations 3 and 9.

The in-coming E now continues only the one sequence at location 4.

This results in a copy pointer starting at location 1 and lasting 4 bytes.

As a third example, consider that a new sequence A B C D K L M is compared with the contents of the history buffer of Table 1. Such a sequence would match as follows:

The in-coming A matches at location 0

The in-coming B continues the matching sequence at location 1.

It will be noted that B also matches at location 7. However, the matching of B with location 7 is ignored because a match sequence has already been started at location 0. This is because no match can commence if an existing matching sequence continues. In other words, a new sequence is not allowed to start when there is a currently active matching sequence.

Thus, when considering the sequence A B C D K L M with the contents of the history buffer shown in Table 1, it can be seen that this received sequence results in a copy pointer starting at address 0 lasting 4 bytes. However, it can be seen that, had the matching sequence been started when B matched at location 7, then this would have resulted in a copy pointer starting at address 7 lasting 6 bytes (i.e. because the sequence B C D K L M matches with the contents of locations 7 to 12).

As such, the conventional hardware is not able determine that the sequence ABCD followed by KLM is a worse set of codewords than A followed by BCDKLM.

FIG. 1 shows a simplified structure of an apparatus 101 for use in an adaptive lossless data compression scheme, for example with a content addressable memory comprising a history buffer 103. The history buffer 103 comprises a plurality of memory locations $105_0$ to $105_n$. In the example shown the history buffer 103 is illustrated as having the values A, B, C, D and E in memory locations $105_0$ to $105_4$. A plurality of comparison units $107_0$ to $107_n$ determine whether or not a value of an input sequence received on an input line d2m (i.e. data-to-match) matches a value of a corresponding memory location $105_0$ to $105_n$.

The apparatus 101 comprises a plurality of AND gates $109_0$ to $109_n$, each AND gate $109_0$ to $109_n$ coupled to receive the output of a corresponding comparison unit $105_0$ to $105_n$ on a first input. Each AND gate $109_0$ to $109_n$ is also coupled to receive the output of an OR gate $111_0$ to $111_n$ on its second input. Each OR gate receives a control signal "A" as a first input ("A" being termed an "ALLOW" signal in the art), and a match signal "m" of a preceding memory location (i.e. m(x−1)) on a second input. The first OR gate $111_0$ will have its second input coupled to the match signal m(n) of the last memory location $105_n$ in the history buffer 103, thus forming a "circular" arrangement. For example, for a 1024 element history buffer, match signal m(1023) will be coupled to the second input of OR gate $111_0$, the match signal m(n) thereby being the effective "preceding" match signal m(x−1). The apparatus 101 also comprises a plurality of delay units $113_0$ to $113_n$ (for example D-type Flip Flops). Each delay unit $113_0$ to $113_n$ is coupled to receive the output of a corresponding AND gate $109_0$ to $109_n$, and output a match signal m(0) to m(n).

A NOR gate 115 receives the plurality of match signals m(0) to m(n) and generates the control signal A (i.e. which is coupled to the first input of each OR gate $111_0$ to $111_n$).

The operation of the circuit shown in FIG. 1 will be described in relation to FIGS. 2 and 3 below.

Figure 2:
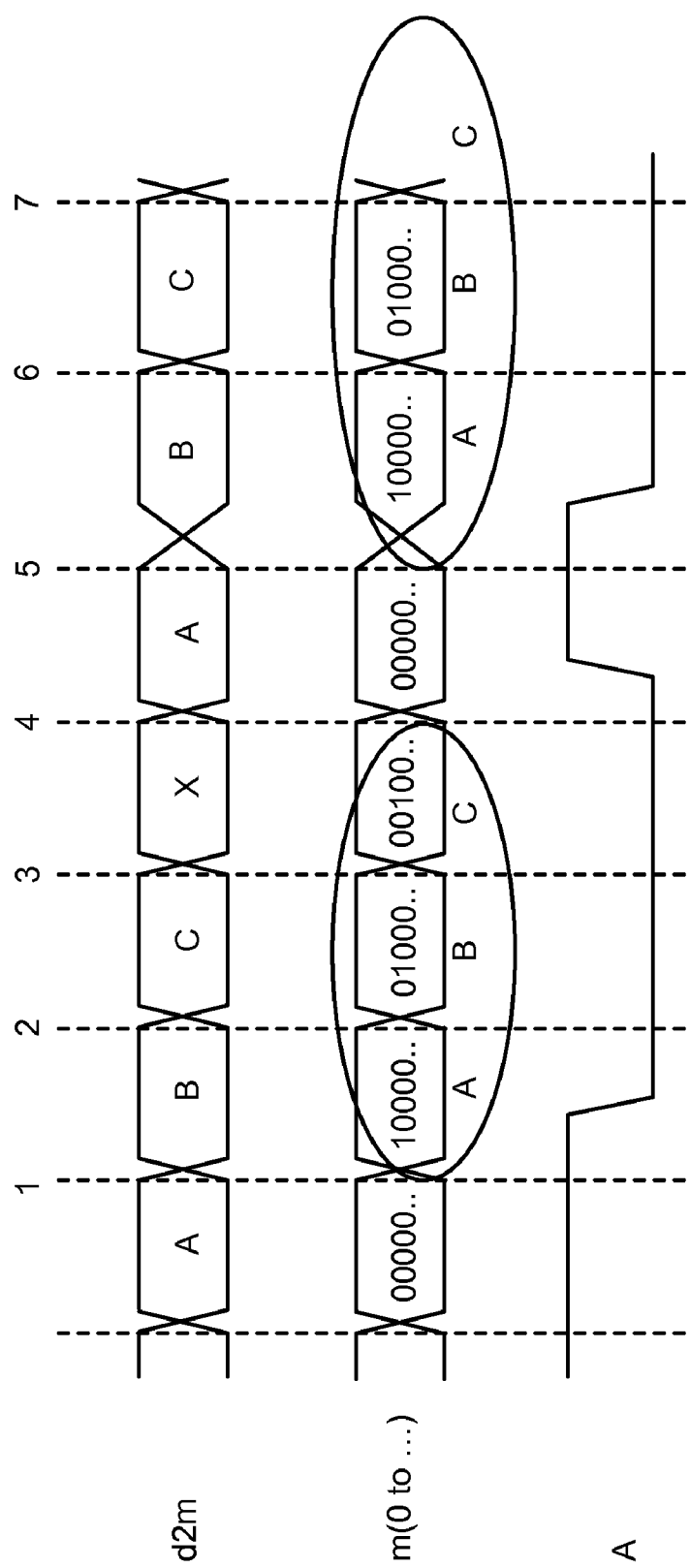
FIG. 2 shows timing diagrams relating to the operation of the circuit shown in FIG. 1 in response to an example of a first input sequence.

Referring to FIG. 2, consider that the following sequence is received on the input line d2m:

Before edge 1, all of the match signals m(0) to m(n) will be at 0. As a consequence, the NOR gate 115 outputs a 1, i.e. such that the control signal A is at 1. A new match sequence is therefore allowed to commence when the control signal A is at 1.

On edge 1 where the value on the input line d2m is A, then the comparison unit $107_0$ detects a match, which in turn results in the AND gate $109_0$ receiving logic 1 on both inputs, which results in the match signal m(0) being set to 1.

Because the match signals m(0) to m(n) are no longer all at zero, the output of the NOR gate 115 (i.e. the control signal A) goes to logic 0. This prevents any new matches from starting.

On edge 2 where d2m comprises value B, then the match signal m(1) is set to 1. It will be noted that although the control signal A on the first input of the OR gate $111_1$ will be 0, the second input of the OR gate $111_1$ will be 1 (i.e. because m(0) is 1), such that the match signal from comparison unit $107_1$ can propagate via the delay unit $113_1$ to provide the match signal m(1).

In a similar manner to the above, on edge 3 for input C, then the match signal m(2) is set to 1.

However, on edge 4 when value X is present on d2m, then the match sequence stops, such that no further match signals m are set. In other words, the output of comparison unit $107_3$ is 0, which results in the match signal m(3) being 0, which in turn causes the NOR gate 115 to become 1, resulting in the control signal A becoming 1.

It can be seen that the match signal bus (the m-bus) has identified a 3-byte sequence, starting at location 0 and ending at location 2.

On edge-5, the process starts over.

Figure 3:
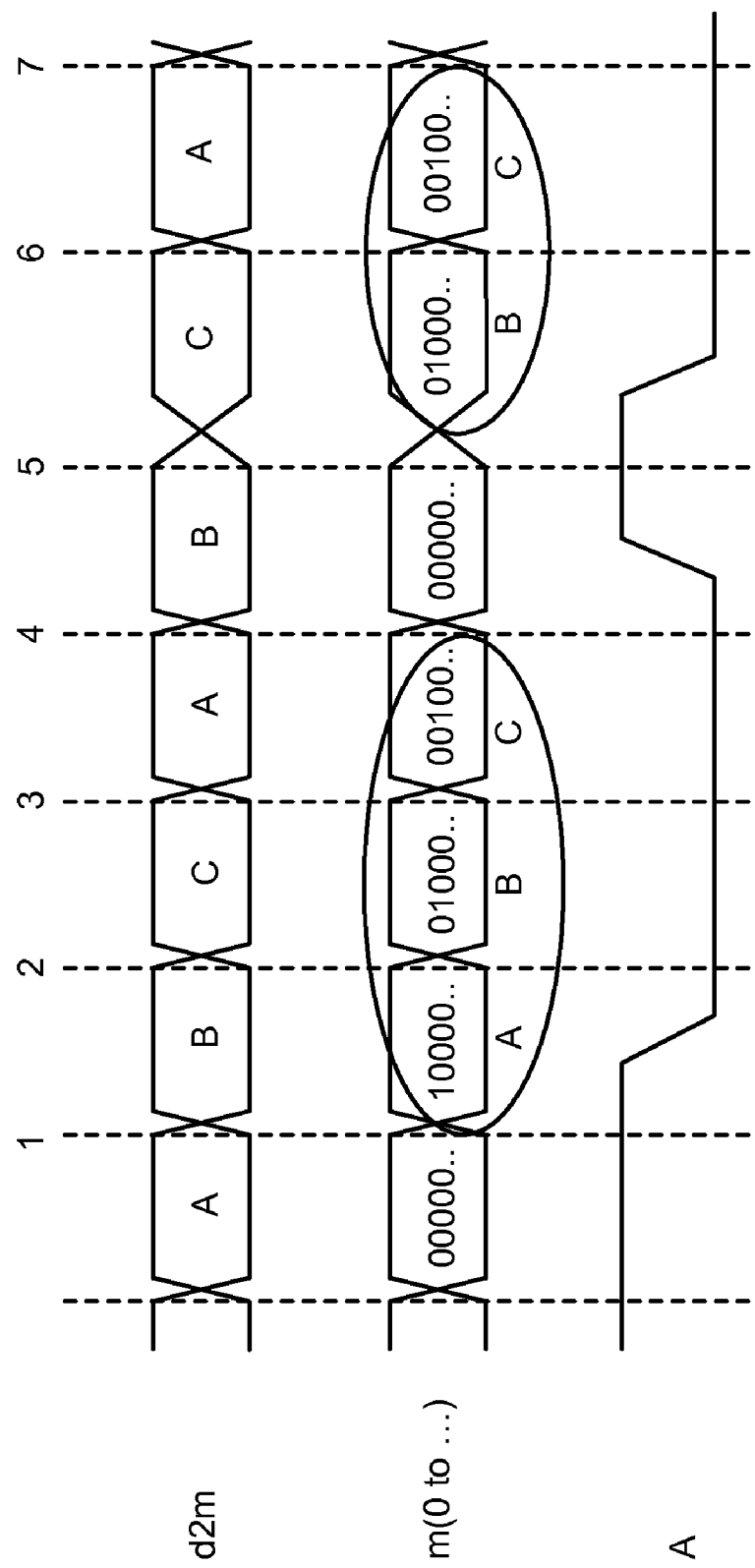
FIG. 3 shows timing diagrams relating to the operation of the circuit shown in FIG. 1 in response to an example of a second input sequence.

Referring to FIG. 3, now consider that the following sequence A B C A B C is received on the input line d2m:

The same procedure as described above applies to edges 1 to 3.

However, with this particular sequence, on edge 4, the match sequence ends such that the match signal m returns to 0.

Although input A matches at address 0, because the control signal A is at 0 and there is no incoming match from below, the match signal m(0) does not become set.

On edge 5, because the control signal A is at 1, then the circuit starts the match sequence B C.

It can therefore be seen that the arrangement of FIG. 1 is not well suited for detecting the sequence A B C A B C.

Figure 4:
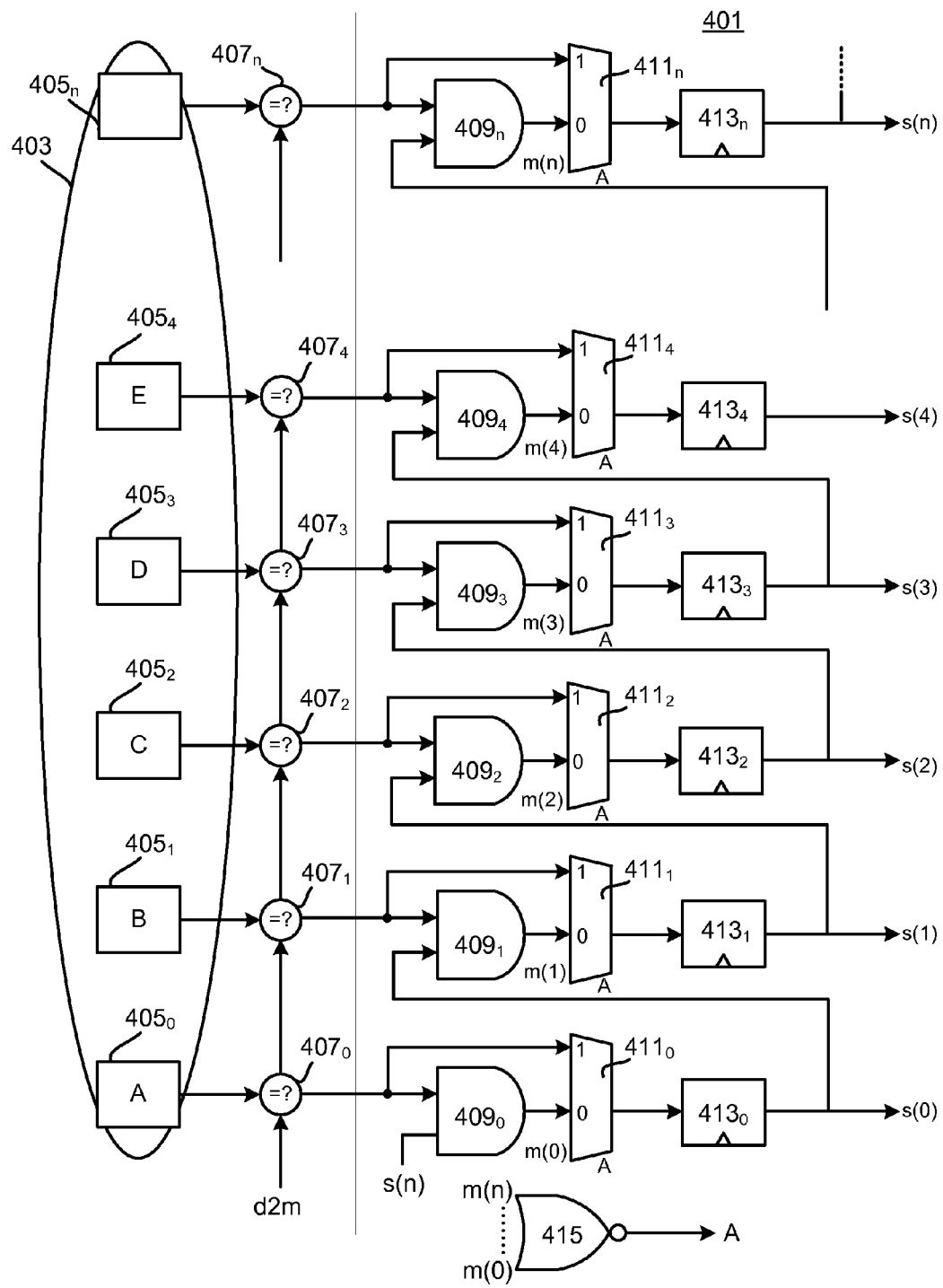
FIG. 4 illustrates another example of an apparatus for use in adaptive lossless data compression using a content addressable memory.

FIG. 4 shows an arrangement having more combinatorial logic for solving this problem.

A history buffer 403 is shown as having a plurality of memory locations $405_0$ to $405_n$. In the example, the history buffer 403 is illustrated as having the values A, B, C, D and E in memory locations $405_0$ to $405_4$. A plurality of comparison units $407_0$ to $407_n$ each determine whether or not a value of an input sequence received on an input line d2m matches a value of a corresponding memory location $405_0$ to $405_n$. The apparatus 401 comprises a plurality of AND gates $409_0$ to $409_n$, each AND gate $409_0$ to $409_n$ coupled to receive the output of a corresponding comparison unit $405_0$ to $405_n$ on a first input. Each AND gate $409_0$ to $409_n$ is also coupled to receive a sequence signal s(x−1) of a preceding memory location on its second input. The first AND gate $409_0$ will have its second input coupled to the sequence signal s(n) of the last memory location $405_n$ in the history buffer 403, thus forming a "circular" arrangement. For example, for a 1024 element history buffer, sequence signal s(1023) will be coupled to the second input of AND gate $409_0$, the sequence signal s(n) thereby being the effective "preceding" sequence signal s(x−1).

The apparatus 401 further comprises a plurality of multiplexer units $411_0$ to $411_n$. Each multiplexer unit $411_0$ to $411_n$ is coupled to receive the output of a corresponding comparison unit $405_0$ to $405_n$ on a first input, and the output of a corresponding AND gate $409_0$ to $409_n$ on a second unit, the outputs of the AND gates $409_0$ to $409_n$ being the match signals m(0) to m(n). Each multiplexer unit $411_0$ to $411_n$ is controlled by a control signal A, and in the example passes the output of the corresponding AND gate $409_0$ to $409_n$, i.e. the match signal m(0) to m(n) when the control signal A is at 0, and passes the output of the corresponding comparison unit $405_0$ to $405_n$ when the control signal A is at 1.

The apparatus 401 also comprises a plurality of delay units $413_0$ to $413_n$ (for example D-type Flip Flops). Each delay unit $413_0$ to $413_n$ is coupled to receive the output of a corresponding multiplexing unit $411_0$ to $411_n$, and provide a corresponding sequence signal s(0) to s(n).

A NOR gate 415 receives the plurality of match signals m(0) to m(n) and generates the control signal A (i.e. which controls the multiplexer units $411_0$ to $411_n$).

If there are no matches at all, then the match signal bus (i.e. the m-bus) will be at 0 (i.e. all match signals m(0) to m(n) are at 0), which means that the NOR gate 415 sets the control signal A to 1. This condition allows any match to become registered as a sequence. However, once a match sequence starts, then the control signal A becomes 0, and as a consequence no new match sequences can start. Once the end of a match sequence is reached, then the control signal A will become 1 again.

Figure 5:
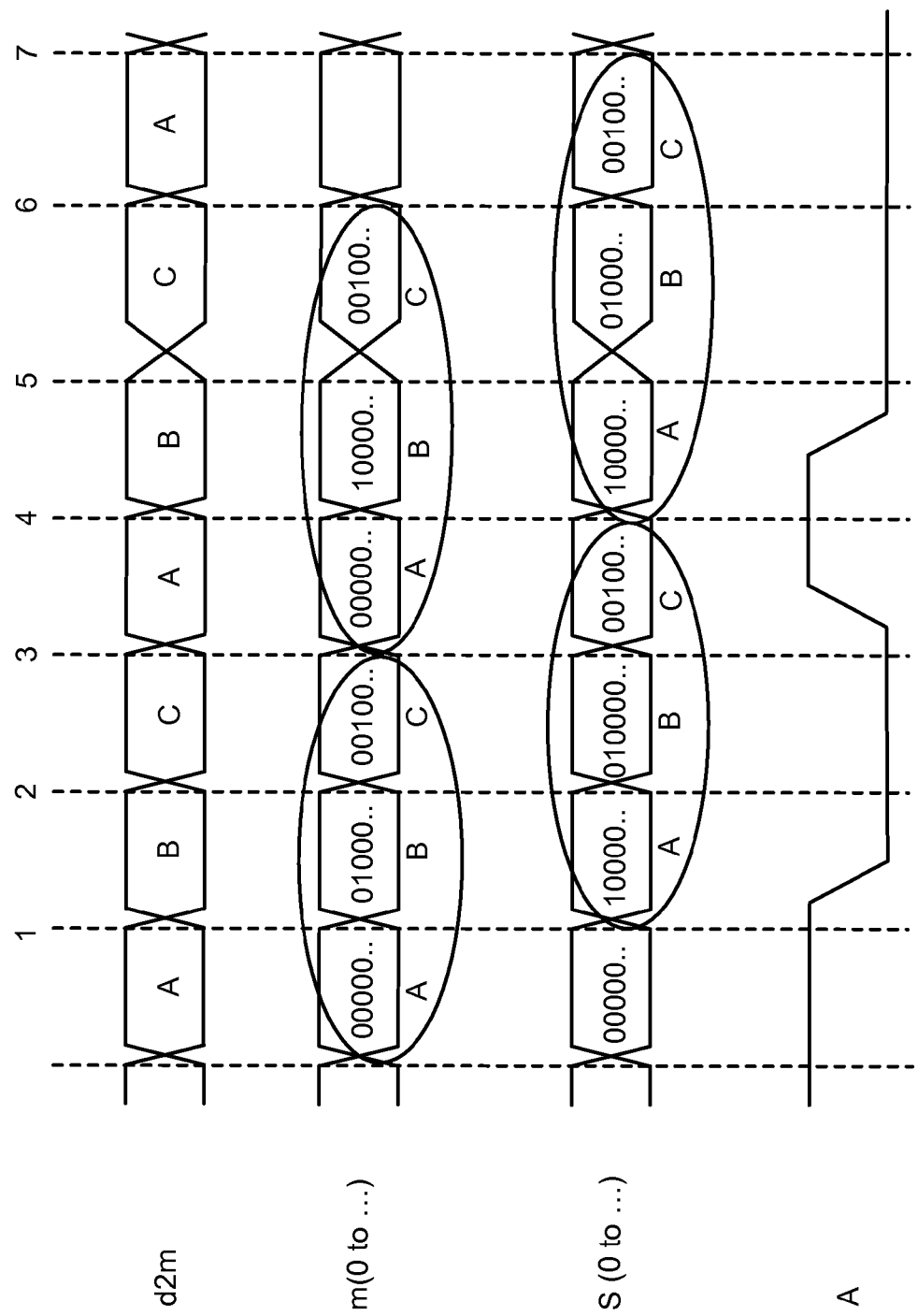
FIG. 5 shows timing diagrams relating to the operation of the circuit shown in FIG. 4 in response to an example of a first input sequence.

Referring to FIG. 5, it can be seen that the arrangement of FIG. 4 handles the input sequence example of A B C A B C (i.e. the same sequence as considered in FIG. 3) as follows:

On edge 1, there are no prior matches, and therefore the match signal bus m is at 0 and therefore the control signal A is at 1. Hence the incoming match goes through as sequence signal s(0).

On edge 2, the match signal m(1) is at 1, and because control signal A is 0 then only the existing sequence can propagate on to s(1).

On edge 3, the match signal m(2) is at 1, and because control signal A is 0 then only the existing sequence can propagate on to s(2).

On edge 4, the match signal m(3) does not become set, therefore the control signal A becomes 1 and a new match propagates into the delay units $413_0$ to $413_n$.

It is noted that the sequence bus (i.e. comprising sequence signals s(0) to s(n)) denotes match sequences:

if all of the sequence signals s(0) to s(n) are null, then all of the match signals m(0) to m(n) will be null, which results in the control signal A being 1 to allow new matches to start.

if any of the sequence signals s(0) to s(n) are non-null, then the match signals m(0) to m(n) will only be non-null for sequences that continue. For an input d2m that does not continue the sequence, then the match signals m(0) to m(n) will become null and the control signal A becomes 1 allowing new sequences to start.

It is noted that the arrangement shown in FIG. 4 therefore provides an improved compression result. However, this is at the expense of a large combinatorial chain, as follows:

1. the incoming sequence value on the signal line d2m must go to all locations of the history buffer 403. Each location generates its own bit of the match signal bus m.
2. The entire match signal bus m must be NOR'd using the NOR gate 415.
3. The output of the NOR gate 415 must then be distributed to all of the multiplexer units $411_0$ to $411_n$.

Such an arrangement has the disadvantage of having a large fan-in and a large fan-out that must be fanned-in and fanned-out in a cascaded arrangement within one clock cycle.

As mentioned in the background section, while a fan-in and fan-out of this type might be acceptable in a history buffer comprising 1,024 bytes, the fan-in and fan-out becomes more of an issue for a larger history buffer, for example a history buffer comprising 16,384 bytes.

Figure 6A:
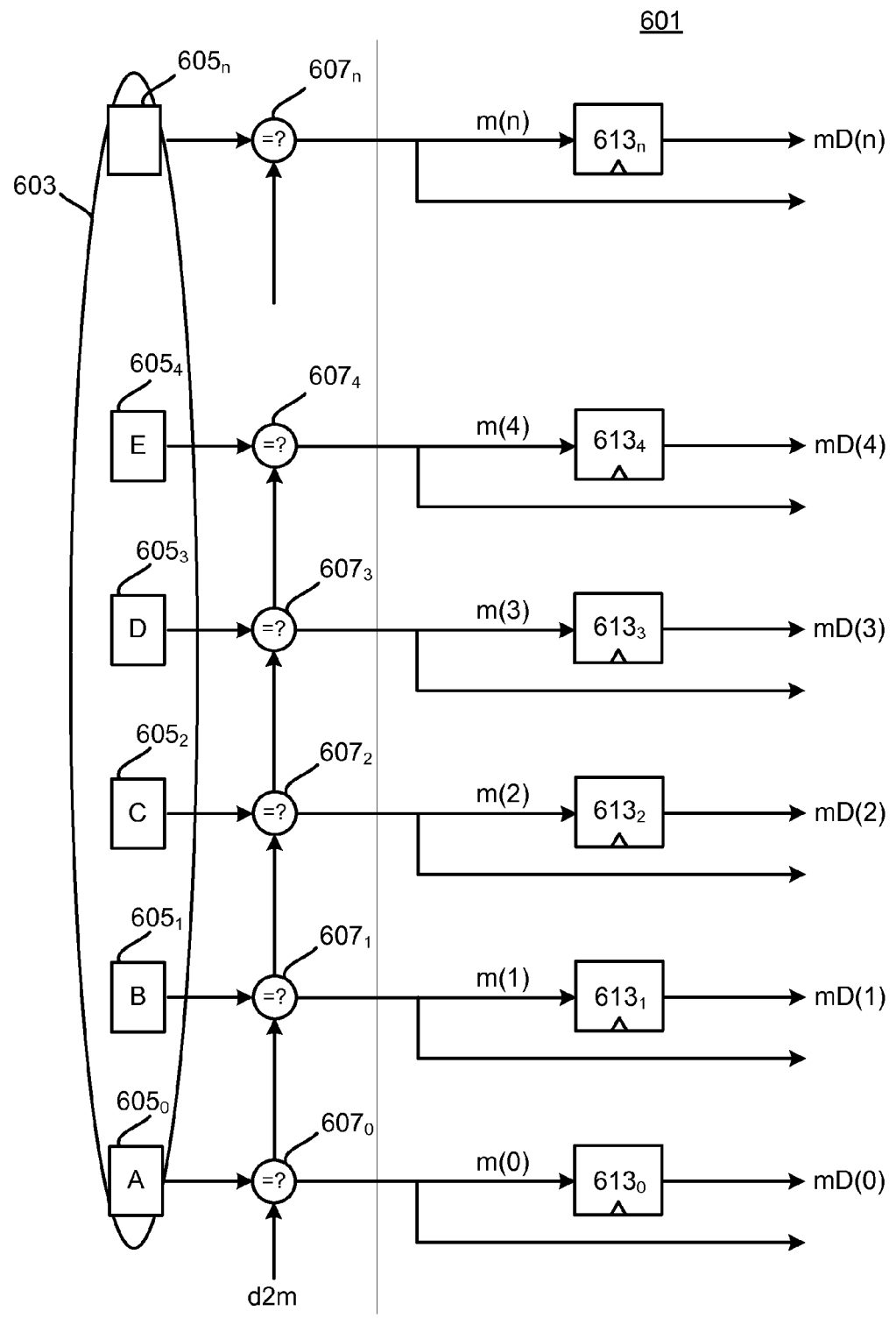
FIG. 6a illustrates an example of a first implementation of an apparatus for use in adaptive lossless data compression, for example using a content addressable memory.

FIG. 6a shows an example of an apparatus according to a first implementation. As will be explained in greater detail below, the implementation shown in FIG. 6 enables the end of a current matching sequence to be predicted, such that the matching of a new sequence is allowed to start immediately.

FIG. 6a shows a history buffer 603 having a plurality of memory locations $605_0$ to $605_n$. In the example, the history buffer 603 is illustrated as having the values A, B, C, D and E in memory locations $605_0$ to $605_4$. A plurality of comparison units $607_0$ to $607_n$ each determine whether or not a value of an input sequence received on an input line d2m matches a value of a corresponding memory location $605_0$ to $605_n$, and accordingly provides a first match signal m(0) to m(n). It is noted that the history buffer 603 and the plurality of comparison units $605_0$ to $605_n$ per se do not form part of the apparatus 601. In other words, the apparatus 601 is concerned with how the first match signals m(0) to m(n) output from the comparison units $605_0$ to $605_n$ are processed.

The apparatus 601 comprises a plurality of delay units $613_0$ to $613_n$. Each delay unit $613_0$ to $613_n$ provides a second match signal mD(0) to mD(n), wherein a second match signal mD(x) is a delayed version of the first match signal m(x).

Figure 6B:
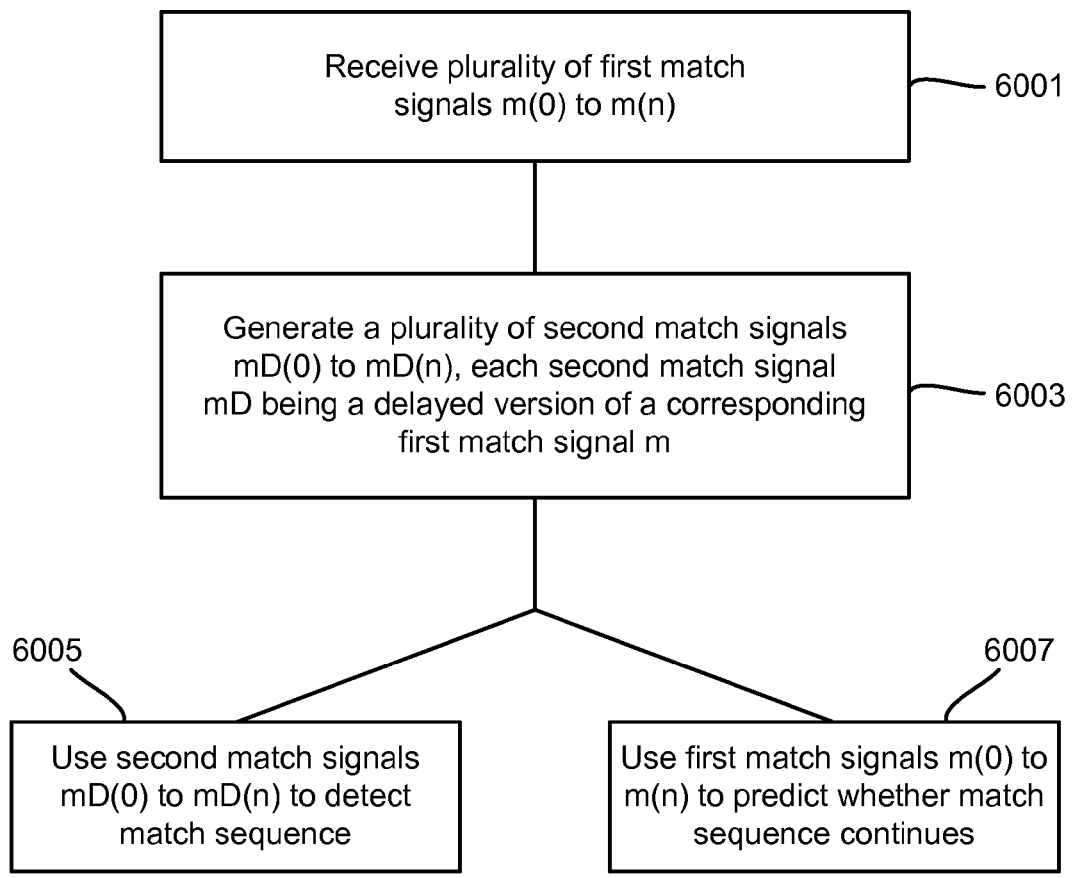

FIG. 6b illustrates the steps that may be performed by the implementation of FIG. 6a. In step 6001 the apparatus receives a plurality of first match signals m(0) to m(n). The plurality of first match signals m(0) to m(n) may have been generated using any one of a number of techniques in the content addressable memory. In step 6003 a plurality of second match signals mD(0) to mD(n) are generated, each second match signal mD(x) being a delayed version of a corresponding first match signal m(x). The second match signals mD(0) to mD(n) are used to detecting a match sequence between data bytes received in the input sequence and data bytes stored in the history buffer, step 6005. The first match signals m(0) to m(n) are used to predict whether the match sequence continues during a subsequent byte of the input sequence, step 6007. It is noted that steps 6005 and 6007 may be performed con-currently. By con-currently it is meant that the steps may overlap at least to some degree, and includes, but is not limited to, the steps being performed simultaneously, or within or between clock cycles.

From the above it will be appreciated that the implementation shown in FIG. 6a provides both a first match signal m and a delayed match signal mD which can be used, as described in greater detail in FIG. 7 below, to predict when the end of the current matching sequence is going to occur, such that the matching of a new sequence can start immediately.

It is noted that the implementations described herein allow the building up of match sequences to be performed independent of what is being input to the history buffer. That is, values can be added to the history buffer concurrently with a matching process being performed. The implementations also enable delays (i.e. clock cycles) to be added onto the matched output as desired for a particular application. The various implementations enable the second (i.e. delayed) match signals mD(0) to mD(n) to be processed in order to determine the sequence matches, while the first (i.e. non-delayed) match signals m(0) to m(n) can be used to predict if the match sequence is going to continue.

Figure 7:
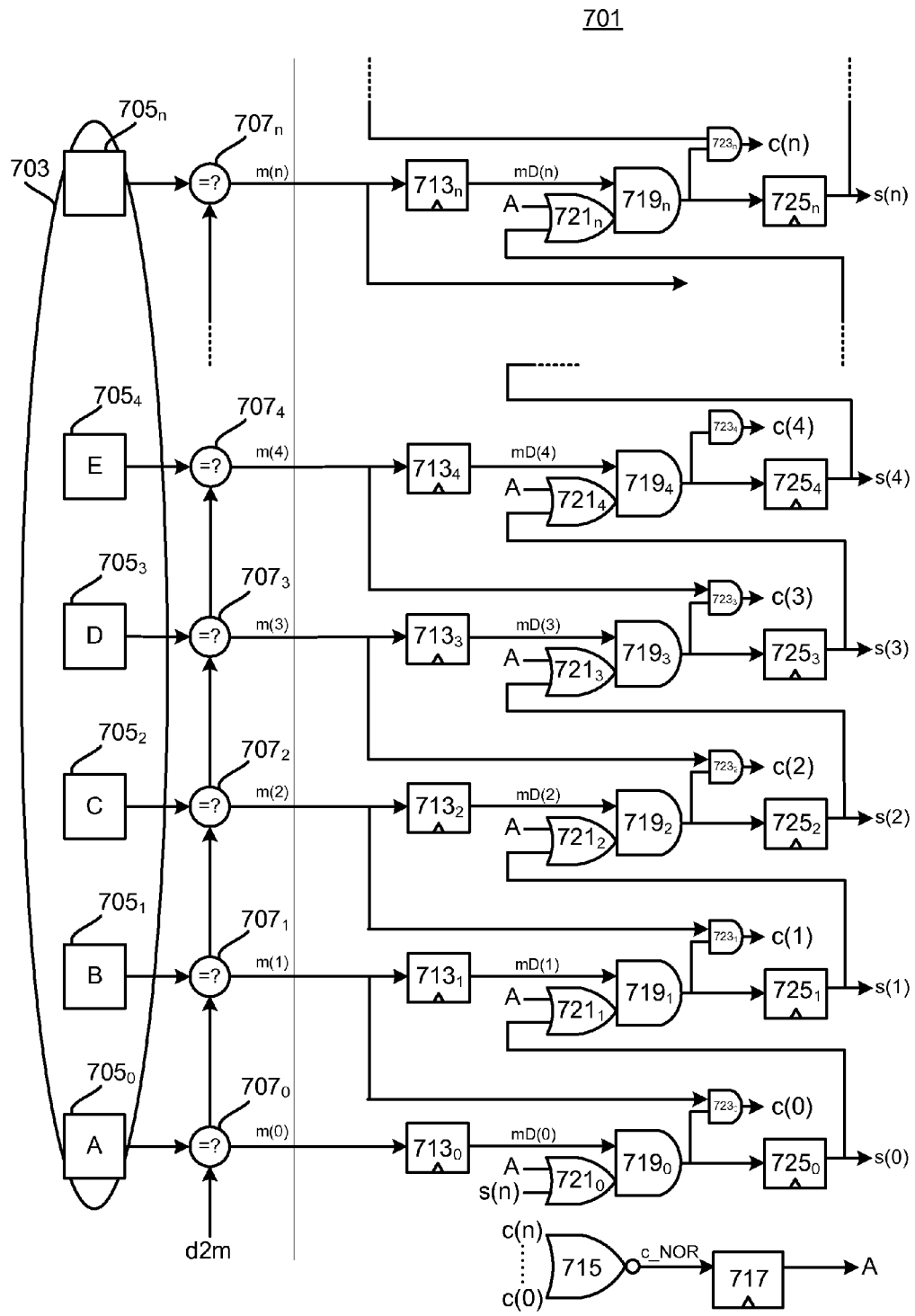
FIG. 7 illustrates an example of another implementation of an apparatus for use in adaptive lossless data compression, for example using a content addressable memory.

FIG. 7 shows an example of an implementation for enabling a prediction of the end/continuation of the matching sequence to be performed.

As with FIG. 6a, FIG. 7 shows a history buffer 703 having a plurality of memory locations $705_0$ to $705_n$. In the example, the history buffer 703 is illustrated as having the values A, B, C, D and E in memory locations $705_0$ to $705_4$. A plurality of comparison units $707_0$ to $707_n$ each determine whether or not a value of an input sequence received on an input line d2m matches a value of a corresponding memory location $705_0$ to $705_n$, and accordingly provides a first match signal m(0) to m(n). As noted above, the history buffer 703 and the plurality of comparison units $705_0$ to $705_n$ per se do not form part of the apparatus 701. In other words, the apparatus 701 is concerned with how the first match signals m(0) to m(n) output from the comparison units $705_0$ to $705_n$ are processed.

The apparatus 701 comprises a plurality of first delay units $713_0$ to $713_n$. Each first delay unit $713_0$ to $713_n$ is coupled to receive a respective first match signal m(0) to M(n), and generate a second matched signal mD(0) to mD(n), wherein a second match signal mD(x) is a delayed version of a first match signal m(x).

The apparatus 701 further comprises a plurality of AND gates $719_0$ to $719_n$, each AND gate $719_0$ to $719_n$ coupled to receive a corresponding second match signal mD(0) to mD(n) on a respective first input. Each AND gate $719_0$ to $719_n$ is also coupled to receive on its second input the output of an OR gate $721_0$ to $721_n$. Each OR gate $721_0$ to $721_n$ receives a control signal "A" as a first input, and a sequence signal s(x−1) of a preceding memory location on a second input. The first OR gate $721_0$ will have its second input coupled to the sequence signal s(n) of the last memory location $705_n$ in the history buffer 703, thus forming a "circular" arrangement. For example, for a 1024 element history buffer, sequence signal s(1023) will be coupled to the second input of OR gate $721_0$, the sequence signal s(n) thereby being the effective "preceding" sequence signal s(x−1).

The apparatus 701 also comprises a plurality of second delay units $725_0$ to $725_n$ (for example D-type Flip Flops). Each second delay unit $725_0$ to $725_n$ is coupled to receive the output of a corresponding AND gate $719_0$ to $719_n$, and provide a sequence signal s(0) to s(n).

According to the implementation of FIG. 7, a continuation bus comprising continuation signals c(0) to c(n) is provided for predicting whether or not a matching sequence continues past a match currently being detected. The continuation signals (c(0) to c(n) are effectively used to control whether an overlapping subsequent sequence is allowed to start. Each continuation signal c(0) to c(n) is generated by continuation detection logic, for example an AND gate $723_0$ to $723_n$ in the implementation of FIG. 7. Each AND gate $723_0$ to $723_n$ is coupled to receive a first match signal m(0) to m(n) from a succeeding memory location on a first input (i.e. AND gate $723_x$ receives first match signal m(x+1) on its first input), and the output of the AND gate $719_0$ to $719_n$ associated with the current memory location on a second input, i.e. based on the second match signal mD(x).

A NOR gate 715 receives the plurality of continuation signals c(0) to c(n) and generates an output signal c_NOR (also referred to herein as the continuation control signal), which is passed via a delay unit 717 to provide the control signal A (i.e. which is coupled to the first input of each OR gate $721_0$ to $721_n$).

Figure 8:
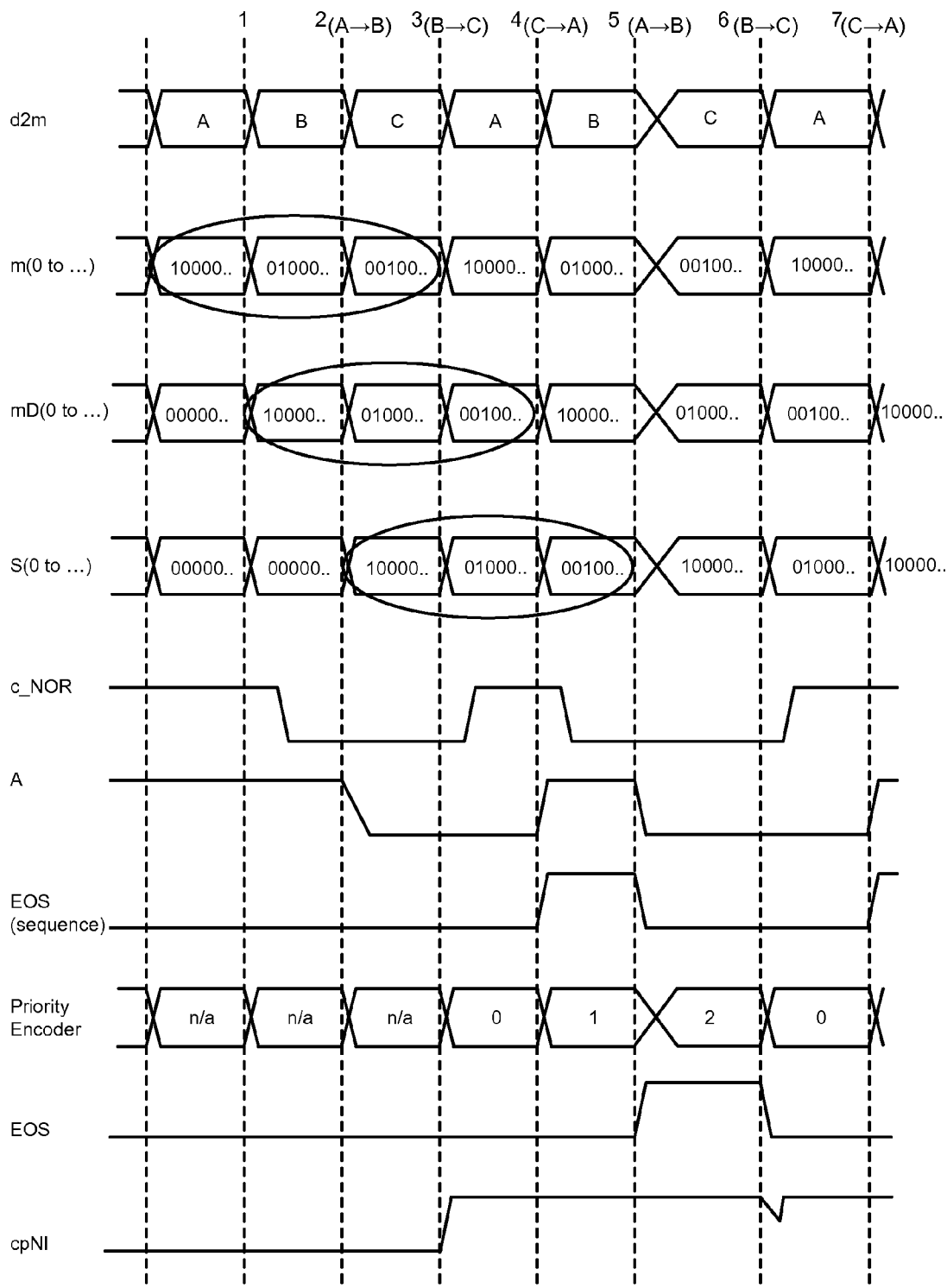
FIG. 8 shows timing diagrams relating to the operation of the circuit shown in FIG. 7 in response to an example of a first input sequence.

Referring to FIG. 8, the input sequence A B C A B C is considered below in relation to the circuit arrangement of FIG. 7.

For ease of reference, there is provided text of the form A→B associated with each clock cycle number. Thus, for edge 2 for example, this shows that byte A is being processed, but that the circuit is looking forward to determine whether the sequence continues with B.

It is noted that the implementation of FIG. 7 again effectively separates what is going into the history buffer 703 from how matches are handled. In other words, on edge 2, although B is being placed into the history buffer 703, the circuitry is effectively processing the data for A (and looking to see if the sequence continues with B).

On edge-1, the combinatorially derived first match signal m(0) shows that element 0 matches, i.e. m(0) equals 1. However, because all of the second (i.e. delayed) match signals mD(0) to mD(n) are 0, then nothing happens.

On edge-2, the first match signal m(1) shows that element 1 matches. More importantly, the second match signal mD(0) is at 1, i.e. because m(0) was 1 during the previous clock cycle. Further, since the control signal A is at 1, then this match is accepted and the sequence signal s(0) becomes 1.

Just before edge-2, the continuation signal c(0) is 1. This indicates that not only is the second match signal mD(0) at 1, but the prediction of the next item in the sequence (i.e. B) also matches (i.e. because the first match signal m(1) is at 1). The continuation signal c(0) equal to 1 causes the NOR gate 715 to go to 0 during this cycle.

On edge-3, the control signal A is at 0, which prevents any new matches from starting.

Hence, at this point in time the apparatus is processing B, but looking forwards to determine what happens with C. In this case, the sequence signal s(0) is at 1 and the second match signal mD(1) is at 1, and hence the sequence signal s(1) becomes 1.

Just before edge-3, because the value C also matches (i.e. the first match signal m(2) is at 1), then the continuation signal c(1) is set to 1 and thus the continuation control signal c_NOR remains 0.

On edge-4, byte C is being processed and the circuit is predicting what effect byte A has.

Firstly, the sequence signal s(1) is at 1 and the second match signal mD(2) is at 1, which results in the sequence signal s(2) being set to 1.

Just before edge-4, the first match signal m(3) is not set (indicating that A does not match at memory location 3), and thus the continuation signal c(2) is not set, and because there are no other matches, the output c_NOR of NOR gate 715 returns to 1.

This means that on edge-4, the control signal A becomes 1.

On edge-5, because the control signal A is at 1, the circuit can now immediately start a new match sequence.

In order to determine when a sequence finishes, an end-of-sequence signal "EOS(sequence)" can be asserted for one cycle when A changes from 0 to 1, which denotes the end of sequence aligned with sequence. The EOS(sequence) signal is similar to the control signal A, but only lasts for one cycle. That is, the control signal A at 0 indicates that a sequence is in progress. The control signal A transitioning to 1 indicates that the sequence is coming to an end and that new sequences can start. Thus, a 0 to 1 transition of the control signal A denotes the end-of-sequence.

The sequence signal can be converted into a priority-encoded address, which is assumed to take one cycle (although it is noted that the priority-encoder can take any number of cycles, provided it is pipelined). The term n/a has been used to represent that no address is valid when the sequence signal s(0) to s(n) is null. The control signal A can therefore be used to detect a rising edge, which then provides an EOS signal that is aligned with the output of the priority-encoder.

In order to indicate when a sequence is detected, an output signal cpNI can be provided. For example, the output signal cpNI can be the registered OR of the sequence signals. Such an implementation requires a further OR gate in FIG. 7 (not shown).

Alternatively, as shown in FIG. 7, the control signal A may be used for this purpose. The control signal A is inverted and extended by one cycle, which is easier to implement that providing an additional OR gate as described above.

Most compression algorithms require a sequence to be limited to 271. To provide this functionality, if required, it can be achieved by forcing the control signal A to 1 after the appropriate number of clock cycles.

Figure 9:
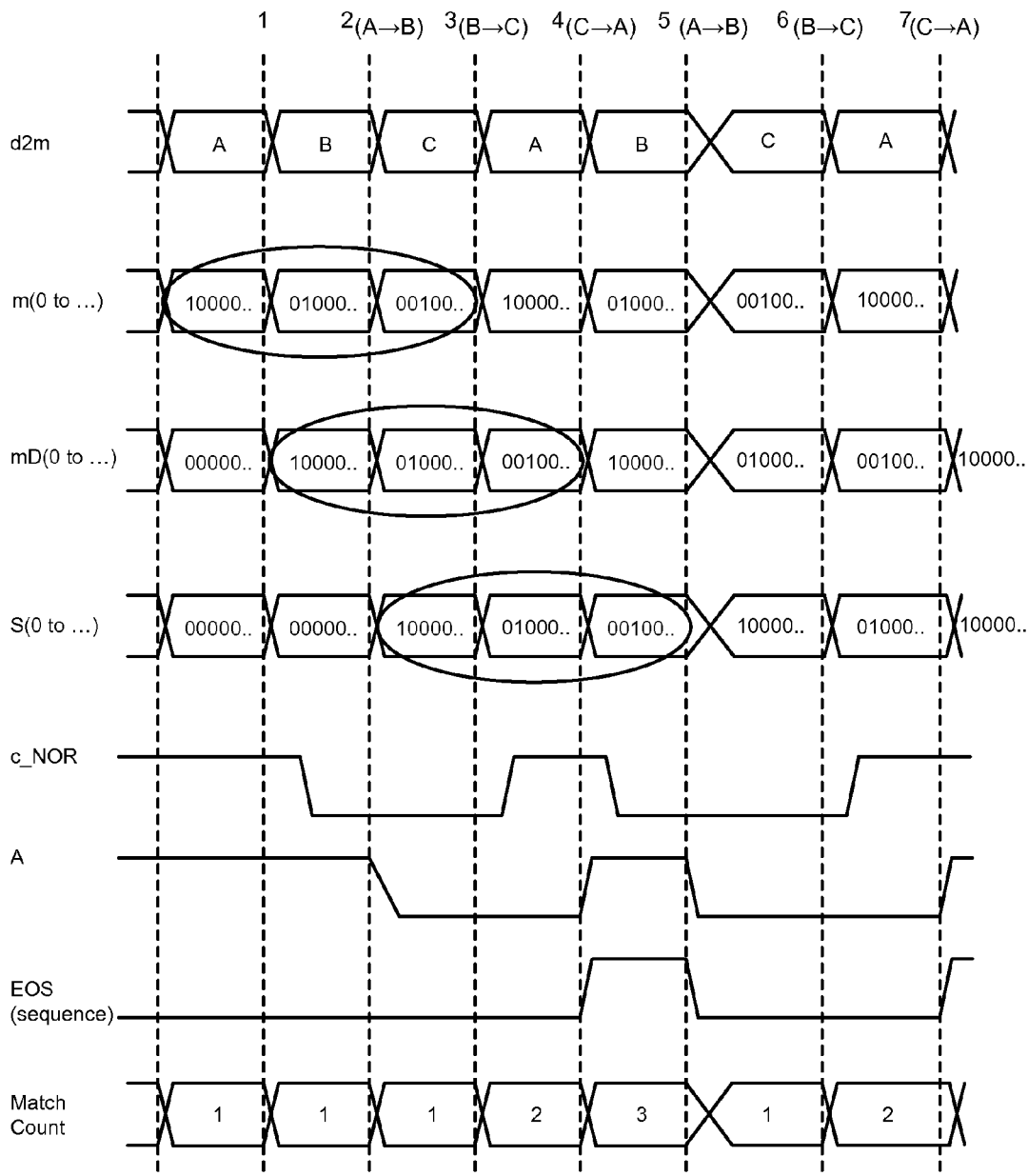
FIG. 9 shows further timing diagrams relating to the operation of the circuit shown in FIG. 7 in response to an example of a first input sequence.

For example, a match counter MatchCount may be provided as shown in FIG. 9 and described below (which assumes as an example that the maximum sequence length is 3):

```
if (ALLOW = '0') then
    MatchCount <= MatchCount + 1;
else
    MatchCount <= (0 => '1', OTHERS => '0'); -- Default to 1
end if;
```

NB—when the count is 2 (i.e. 1 less than the target MAX_LENGTH) the signal c_NOR can be artificially changed as follows:

```
v_c_NOR := c_NOR;
    if (MatchCount = MAX_MATCH_LENGTH-1) then
        v_c_NOR := '1';
    end if;
```

Such an implementation requires a relatively small amount of additional logic on the output of the NOR gate 715.

It is noted that by incrementing the value MatchCount when the control signal A is at 0, the value is only incremented when it is known that a sequence is going to continue. That is, by virtue of the fact that MatchCount is 2, it is known (with the control signal A at 0), that it will go to 3. Hence detecting a count of 2 is sufficient.

The implementation described above in relation to FIGS. 7, 8 and 9 provides an apparatus for use with CAM based ALDC that provides an improved compression ratio, since the apparatus is able to predict when a matching sequence is going to end, such that a new matching sequence can commence.

The implementation shown in FIG. 7 provides a circuit arrangement having a relatively small amount of combinatorial logic. However, it can be seen that a D-type needs to fan-out to all locations of the history buffer (for example 1,024 cells for LTO 3/4/5 modes or 16,384 cells for LTO 6 mode), be combined with some local logic in each cell and a status signal, and then combined from all cells back to a D-type, which all needs to be done in one cycle. The cascaded fan-in and fan-out is therefore relatively large.

Figure 10:
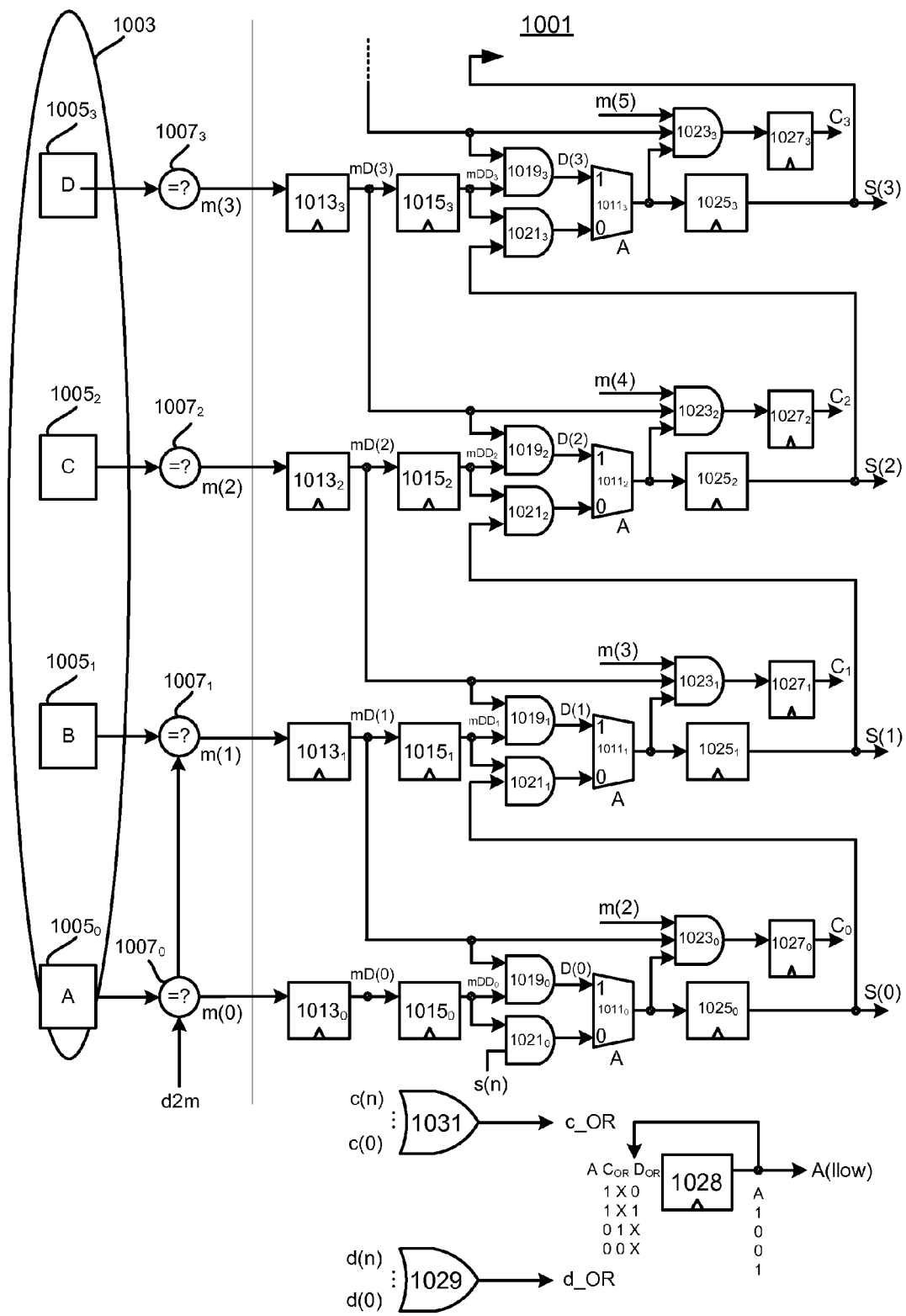
FIG. 10 illustrates an example of another implementation of an apparatus for use in adaptive lossless data compression, for example using a content addressable memory.

FIG. 10 is an example of another implementation having an improved fan-in and fan-out.

FIG. 10 shows a history buffer 1003 having a plurality of memory locations $1005_0$ to $1005_n$ (only $1005_0$ to $1005_3$ being shown for clarity). In the example, history buffer 1003 is illustrated as having the values A, B, C and D in memory locations $1005_0$ to $1005_3$. A plurality of comparison units $1007_0$ to $1007_n$ determine whether or not a value of an input sequence received on an input line d2m matches a value of a corresponding memory location $1005_0$ to $1005_n$, and accordingly provides a first match signal m(0) to m(3).

The apparatus 1001 comprises a plurality of first delay units $1013_0$ to $1013_n$. Each first delay unit $1013_0$ to $1013_n$ is coupled to receive a respective first match signal m(0) to m(n) and output a second match signal mD(0) to mD(n), wherein the second match signal mD(0) to mD(n) is a delayed version of the first match signal m(0) to m(3).

The apparatus 1001 further comprises a plurality of second delay units $1015_0$ to $1015_n$. Each second delay unit $1015_0$ to $1015_n$ is coupled to receive a respective second match signal mD(0) to mD(n) and output a third match signal mDD(0) to mDD(3), wherein the third match signal mDD(0) to mDD(3) is a delayed version of the second match signal mD(0) to mD(3), and hence a twice delayed version of the first match signal m(0) to m(3).

The apparatus 1001 further comprises a first plurality of AND gates $1019_0$ to $1019_n$, each AND gate $1019_0$ to $1019_n$ coupled to receive a corresponding third match signal mDD(0) to mDD(n) on a respective first input. Each of the first plurality of AND gates $1019_0$ to $1019_n$ is also coupled to receive on its second input a second match signal mD(0) to mD(n) from a succeeding memory location of the history buffer, i.e. an AND gate $1019_x$ will receive a second match signal mD(x+1) on its second input. For example, the AND gate $1019_0$ is coupled to receive on its second input the second match signal mD(1) from its succeeding memory location, and receive on its first input the third match signal mDD(0) relating to its own history buffer location. The plurality of AND gates $1019_0$ to $1019_n$ produce a plurality of "DETECTION" signals D(0) to D(n), the collection of detection signals D(0) to D(n) also being referred to hereinafter as the "D-Bus". It can be seen that each signal on the D-Bus predicts that there is a minimum 2-byte sequence ahead.

The apparatus 1001 also comprises a second plurality of AND gates $1021_0$ to $1021_n$. Each AND gate $1021_0$ to $1021_n$ is coupled to receive a corresponding third match signal mDD(0) to mDD(n) as a first input. Each AND gate $1021_0$ to $1021_n$ is also coupled to receive a sequence signal s(0) to s(3) from a preceding memory location on a second input, i.e. an AND gate $1021_x$ will receive a sequence signal s(x−1) on its second input. The first AND gate $1021_0$ is coupled to the sequence signal s(n) of the last memory location $1005_n$ in the history buffer 1003, thus forming a "circular" arrangement. For example, for a 1024 element history buffer, sequence signal s(1023) will be coupled to the second input of AND gate $1021_0$, the sequence signal s(n) thereby being the effective "preceding" sequence signal s(x−1).

The apparatus 1001 further comprises a plurality of multiplexer units $1011_0$ to $1011_n$. Each multiplexer unit $1011_0$ to $1011_n$ is coupled to receive the output of a corresponding AND gate $1019_0$ to $1019_n$ on a first input, and an output from a corresponding AND gate $1021_0$ to $1021_n$ on a second input. Each multiplexer unit $1011_0$ to $1011_n$ is controlled by a control signal A, and in the example passes a respective D-Bus signal D(0) to D(n) (i.e. output from a respective one of the plurality of first AND gates $1019_0$ to $1019_n$) when the control signal A is at 1, and the output of a respective one of the plurality of second AND gates $1021_0$ to $1021_n$ when the control signal A is at 0.

Each multiplexer unit $1021_0$ to $1021_n$ outputs a respective sequence signal S(0) to S(n) via a corresponding one of a plurality of third delay units $1025_0$ to $1025_n$.

The apparatus 1001 also comprises a plurality of third AND gates $1023_0$ to $1023_n$. Each of the plurality of third AND gates $1023_0$ to $1023_n$ is configured to predict 2 bytes ahead, and is coupled to receive:

on a first input, an output of a multiplexer unit $1011_0$ to $1011_n$ relating to its corresponding history buffer location, say x, and in particular the third match signal mDD (x);

on a second input, a second match signal mD(x+1) relating to a next succeeding history buffer memory location;

on a third input, a first match signal m(x+2) relating to a next-but-one succeeding history buffer memory location.

For example, the AND gate $1023_0$ is coupled to receive the third match signal mDD(0) on a first input, the second match signal mD(1) on a second input, and the first match signal m(2) on a third input.

The output of each AND gate $1023_0$ to $1023_n$ is passed via a fourth plurality of delay gates $1027_0$ to $1027_n$ to produce a corresponding one of a plurality of continuation signals C(O) to C(n). The plurality of continuation signals C(0) to C(n) are also referred to hereinafter as the "C-Bus". It can be seen that each signal on the C-Bus predicts that there is a minimum 3-byte sequence ahead.

The apparatus 1001 further comprises a first OR gate 1029 that is coupled to receive the plurality of detection signals D(0) to D(n) of the D-Bus, and provide an output signal d_OR. The apparatus 1001 also comprises a second OR gate 1031 that is coupled to receive the plurality of continuation signals C(0) to C(n) of the C-Bus, and provide an output signal c_OR.

The behaviour of the apparatus shown in FIG. 10 will be observed as follows, with respect to the effect of the pipelined matching signals m, mD and mDD:

Suppose the history buffer contains A B C D (i.e. location 0 contains A, location 1 contains B, location 2 contains C and location 3 contains D).

Suppose the input sequence A, then B then C is received on the signal line d2m.

When A matches the first match signal m(0) from the plurality of first match signals is asserted to 1.

On the next cycle, when B matches, the first match signal m(1) from the plurality of first match signals is asserted to 1, but the second match signal mD(0) from the plurality of second match signals is also asserted to 1.

On the next cycle, when C matches, the first match signal m(2) from the plurality of first match signals is asserted to 1, the second match signal mD(1) from the plurality of second match signals is asserted to 1, and the third match signal mDD(0) from the plurality of third match signals is also asserted 1.

It can therefore be seen that, when the apparatus 1001 detects a third match signal mDD(0) from the plurality of third match signals being 1, then the apparatus is also able to preview what also happens for cells 1 and 2 by looking at the second match signal mD(1) from the plurality of second match signals and the first match signal m(2) from the plurality of first match signals. If all three are at 1, then the apparatus is able to determine that there is at least a 3-byte matching sequence. It is noted that the control signal A is used to determine if the circuit is sensitive to c_OR or d_OR.

It is also noted that the D-bus has a dual use. The D-bus is used to detect a 2-byte sequence anywhere in the history buffer. In particular, the signal d_OR is set if there is a 2-byte sequence anywhere in the history buffer. In the quiescent state, where there have been no matches, then the control signal A will be 1 (allowing new matches to enter the sequence detector). With the control signal set at 1, then if there are any 2-byte sequences present, then a multiplexing unit $1011_x$ for the cell with the first of two-bytes will allow the D bit to be fed into the sequence detectors.

The sequence signal s will only get set for matches of 2 bytes or greater. Simultaneously, the detection control signal d_OR will be 1 and so the truth-table in FIG. 10 shows that the control signal A will become 0. This then prevents new matches from starting, and only those sequences that continue will be able to propagate.

Simultaneously with the above, the C-bus is also updated. On the presumption that there is a 1 going into the sequence registers (s), then the circuit is configured to look ahead to see if there are 2 more bytes matching. For example, the plurality of AND gates $1023_0$ to $1023_n$ enable this to be achieved. In particular, each AND gate $1023_n$ receives the signals mDD (x), mD(x+1), m(x+2). If the result is a 1, then there are at least two more bytes matching and the control signal A is therefore retained at 0.

It will be appreciated from the above the each AND gate $1023_x$ is coupled to receive the match signal for the current cell x but twice delayed, i.e. the third match signal mDD(x), the second match signal from the neighbouring cell x+1 but once delayed, i.e. the second match signal mD(x+1), and the first match signal (i.e. non-delayed) from the cell x+2, i.e. the first match signal m(x+2).

Thus, it can be seen that, for a sequence of just 2-bytes, then the continuation signals on the continuation bus C-Bus are not asserted.

Hence, for a 2-byte sequence, the control signal A will transition from 1 to 0 on processing byte 1 of the 2-byte sequence. Then, on processing the second byte of the 2-byte sequence, because c_OR is 0, then the control signal A will return to 1, ready for the next byte that follows the two-byte sequence.

For a 3-byte sequence, the control signal A will transition from 1 to 0 on processing byte 1 of the 3-byte sequence. At the same time, the continuation signal C(x) will become 1. Thus, when the second byte of the 3-byte sequence is processed, because c_OR is at 1, then the control signal A will remain at 0. Also, because the circuit is in the middle of a 3-byte sequence, the continuation signal C(x) will return to 0. When the third byte of the 3-byte sequence is processed, c_OR will be 0, and so the control signal A will transition back to 1, ready for the next byte following the 3-byte match.

The operation of the circuit described above in FIG. 10 can be further explained with reference to FIGS. 11 and 12, and the following example whereby the history buffer 1003 is assumed to contain the contents shown below:

| Location | 0 | 1 | 2 | 3 |
| --- | --- | --- | --- | --- |
| Contents | A | B | C | D |

Consider that the received input sequence is $A_{first}$ B C A B A B $C_{last}$.

The circuit of FIG. 10 will produce a copy pointer for ABC starting at location 0; a copy pointer for AB starting at location 0; and another copy pointer for ABC again at location 0.

Figure 11:
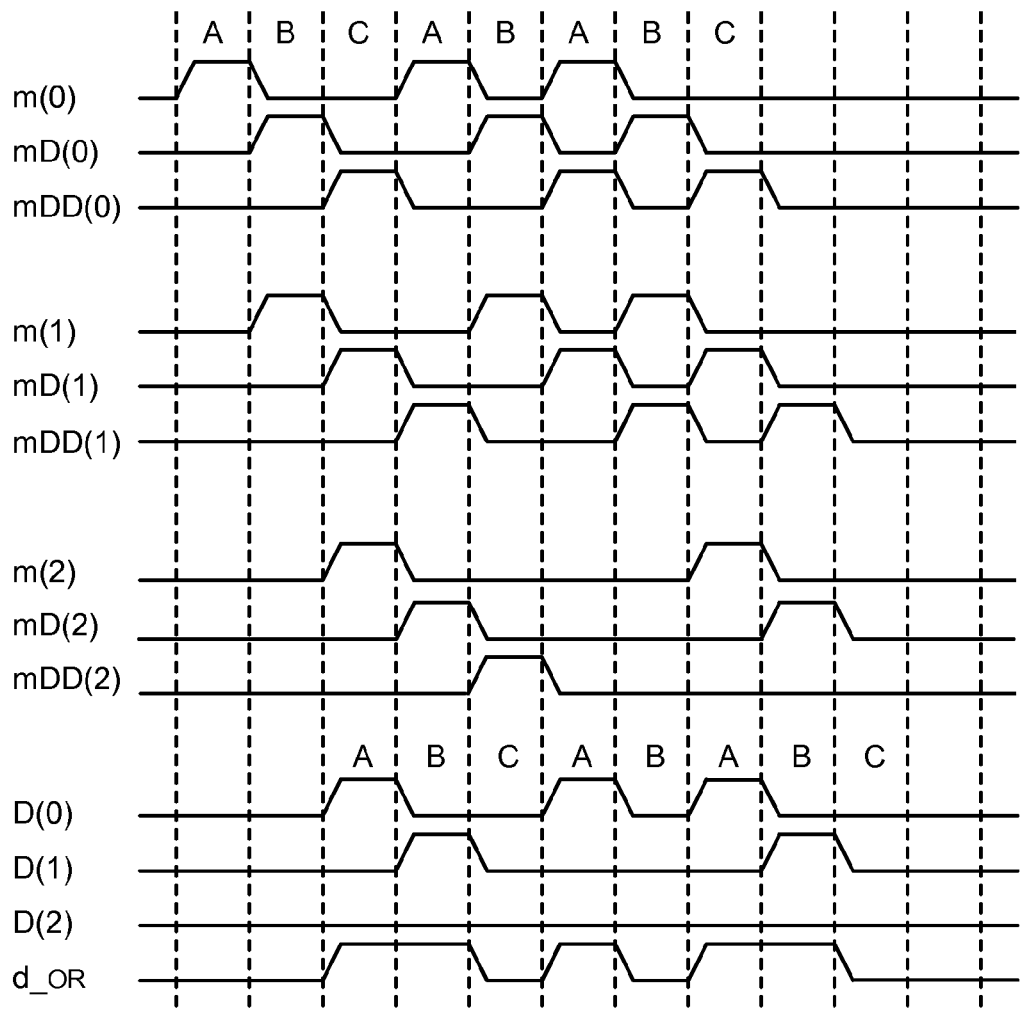
FIG. 11 shows timing diagrams relating to the operation of the circuit shown in FIG. 10 in response to an example of a first input sequence.

FIG. 11 shows a simplified signal diagram relating to the generation of the match flags through the pipelines and the generation of detection signals D and the detection control signal d_OR.

The top three groups of signals show the effects of pipe-lining the match flags.

1. 'A' matches location 0 three times and this match propagates down the pipeline.
2. 'B' matches location 1 three times and this match propagates down the pipeline.
3. 'C' matches location 2 two times and this match propagates down the pipeline.

The lower group of signals shows the construction of the D-bus and its OR-ing. It can be noted that the lettering above $D_0$ is shifted with respect to the lettering above $m_0$ to reflect the fact that the match flags are being processed at the end of the pipe-lining.

4. The D bus indicates if there are 2-byte sequences matching and D is combinatorially derived from the second match signals mD and third match signals mDD signals.

As such, it can be seen that $D_0$ is set three times because the two-byte sequence AB is seen 3 times.

It can also be seen that $D_1$ is set two times because the two-byte sequence BC is seen 2 times.

It can also be seen that $D_2$ is not set because there are no 2-byte sequences with C as the first byte.

Figure 12:
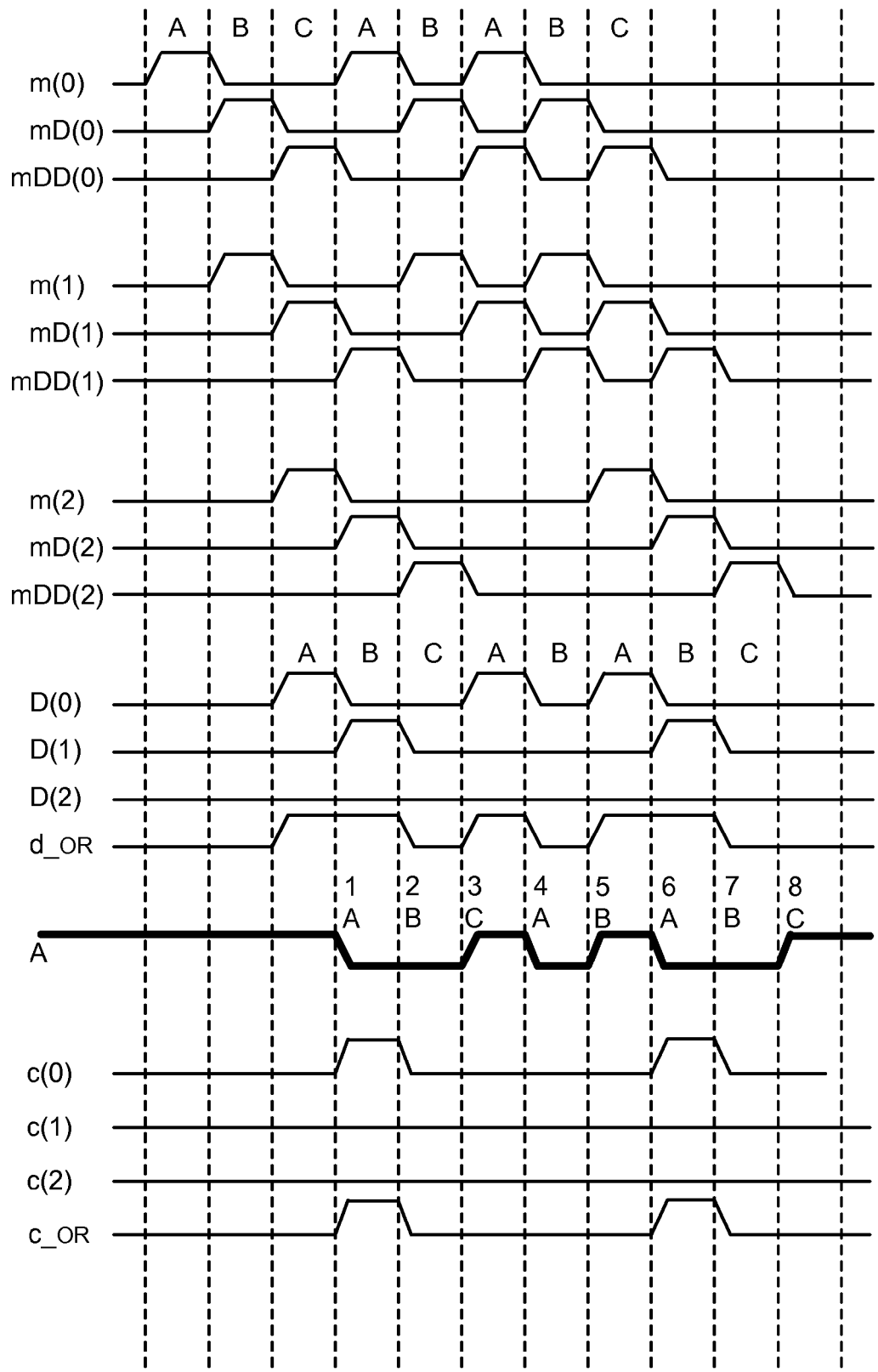
FIG. 12 shows further timing diagrams relating to the operation of the circuit shown in FIG. 10 in response to an example of a first input sequence.

FIG. 12 shows in greater detail how the control signal A and continuation signals c(0) to c(n) and continuation control signal c_OR are generated based on the example of the input sequence described above with reference to FIGS. 10 and 11. The control signal A is shown in bold.

The edges 1 through 8 have been labelled, and they have been associated with bytes that are being processed into the sequence (s) registers. That is, on edge 1, byte A is effectively being processed; on edge 2 byte B is effectively being processed, and so forth.

When byte A is being processed on edge 1, the following events occur:

The detection control signal d_OR is at 1. This gives an indication that there is at least one 2-byte sequence. Because the control signal A is at 1, then any sequence starting at this point can proceed and so the control signal A needs to be set to 0 for subsequent bytes. The truth-table for the control signal A shows this.

Because the control signal A is at 1, then the D-bus is allowed into the sequence registers. Hence s(0) becomes set.

The value placed into the sequence registers is also ANDed with two match flags. For example, for s(0), the circuit ANDs with $mD_1$ and $m_2$. This causes $C_0$ to get set and shows that at least two more bytes match after A. $C_0$ is the only bit to get set.

When byte B is being processed on edge 2, the following events occur:

Because the control signal A is at 0, only sequences already in progress can propagate. Hence only the sequence signal s(1) gets set.

Because the control signal A is at 0, the continuation control signal c_OR is seen to be 1, and so the control signal A is held at 0. The continuation control signal c_OR being set at 1 indicates that the sequence is not about to end.

The logic feeding D-in for s(1) also ANDs two more bits of the match logic. But only 1 bit is set and so c(1) remains at 0.

When byte C is being processed on edge 3, the following events occur:

Because the control signal A is at 0, only sequences already in progress can propagate. Hence only s(2) gets set.

Because the control signal A is at 0 and c_OR is at 0, then this indicates that the sequence is coming to an end, and therefore the control signal A is returned to 1, ready for edge 4 where byte A is processed.

This logic follows for the remainder of the sequence.

It will be appreciated from above that the implementation of FIG. 10 provides an apparatus that enables compression to be performed efficiently, and with a reduced fan-in and fan-out requirement.

Furthermore, the implementation of FIG. 10 enables fan-in and fan-out to be carried out concurrently, rather than having sequential fan-in and fan-out in just one clock cycles. In other words, a fan-in is performed concurrently and in parallel in the same clock cycle as a fan-out. As such, the match signals from all history buffer locations are fanned-in to determine a match status concurrently with the fanning-out being performed to distribute the determined status for further processing.

The implementations shown in the figures above relate to a content addressable memory that is capable of processing 1-byte per cycle, i.e. having a history buffer that is able to process one byte at a time.

Figure 13A:
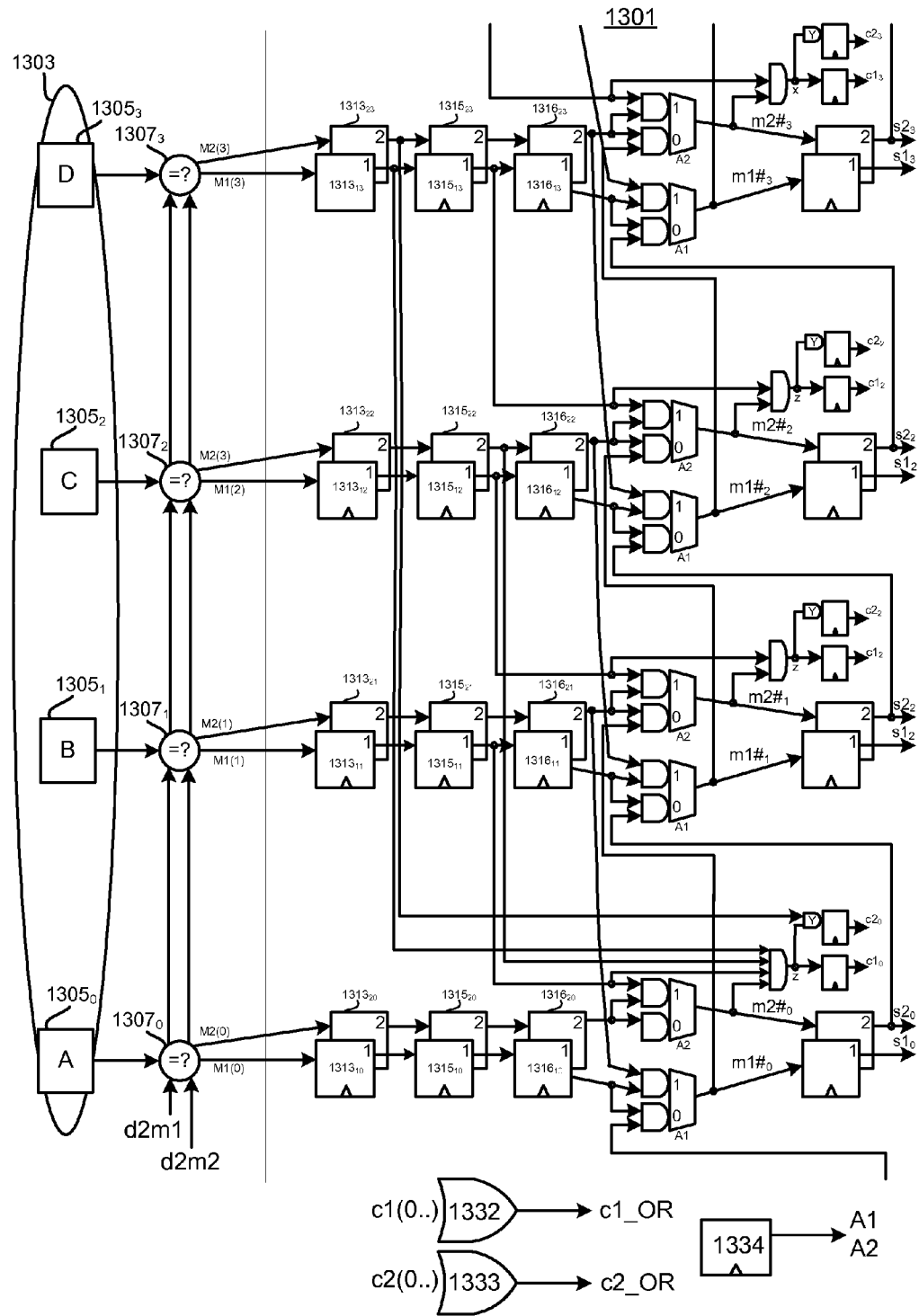
FIGS. 13a to 13d illustrate an example of another implementation of an apparatus for use in adaptive lossless data compression, for example using a content addressable memory.

FIG. 13a shows an example of an implementation relating to a content addressable memory that can handle two bytes per cycle. As with the implementation above, although the example will be described in relation to a CAM having a history buffer, it is noted that the implementations below may be used with any set of storage locations that are capable of receiving data that is to be matched, processing 2-bytes per cycle, and generating corresponding match flags.

A history buffer 1303 comprises any register or memory based system that enables two bytes to be written into the history buffer 1303 on every cycle, and two bytes to be matched against every byte in the history buffer 1303 every cycle.

The apparatus 1301 according to the implementation of FIG. 13a also comprises match flag pipe-lining, which allows for sequences of 2+, 3+ and 4+ bytes to be detected in advance.

The apparatus 1301 also comprises AND-MUX control logic for feeding the sequence registers, the AND-MUX control logic being controlled by first and second control signals A1 and A2, further details of which will be described later in the application. The AND-MUX control logic controls how new match sequences are allowed to start, and where already-in-progress match sequences are allowed to continue.

The apparatus 1310 also comprises logic circuitry for generating the first and second control signals A1 and A2. This circuitry is configured such that it takes account of what is coming up-ahead in order to set the first and second control signals A1 and A2.

A history buffer 1303 comprises a plurality of memory locations $1305_0$ to $1305_n$ (only cells 0 to 3 and their associated circuitry being shown for clarity). In the example, history buffer 1303 is illustrated as having the values A, B, C and D in memory locations $1305_0$ to $1305_3$. The apparatus 1301 also comprises a plurality of comparison units $1307_0$ to $1307_n$. Each comparison unit $1307_0$ to $1307_n$ determines whether or not a first value of an input sequence received on a first input line d2m1 matches a value of a corresponding memory location $1305_0$ to $1305_n$, and in the same clock cycle also determine whether or not a first value of an input sequence received on a second input line d2m2 matches a value of a corresponding memory location $1305_0$ to $1305_n$. Each comparison unit $1307_0$ to $1307_n$ outputs a pair of first match signals, i.e. a first set of first match signals m1(0) to m1(n) and a second set of first match signals m2(0) to m2(n).

The apparatus 1301 also comprises a plurality of pairs of first delay units, $1313_{10}$ and $1313_{20}$ for cell (0), $1313_{11}$ and $1313_{21}$ for cell (1) . . . to $1313_{1n}$ and $1313_{2n}$ for cell (n). The plurality of pairs of first delay units generate pairs of second match signals m1D(0), m2D(0) to m1D(n) to m2D(n), i.e. which are delayed once compared to the pairs of first match signals m1(0), m2(0) to m1(n) to m2(n).

The apparatus 1301 also comprises a plurality of pairs of second delay units, $1315_{10}$ and $1315_{20}$ for cell (0), $1315_{11}$ and $1315_{21}$ for cell (1) . . . to $1315_{1n}$ and $1315_{2n}$ for cell (n). The plurality of pairs of second delay units generate pairs of second match signals m1DD(0), m2DD(0) to m1DD(n), m2DD(n), i.e. which are delayed once compared to the pairs of second match signals mD1(0), m2D(0) to m1D(n), m2D(n), or delayed twice compared to the pairs of first match signals m1(0), m2(0) to m1(n), m2(n).

The apparatus 1301 also comprises a plurality of pairs of third delay units, $1316_{10}$ and $1316_{20}$ for cell (0), $1316_{11}$ and $1316_{21}$ for cell (1) . . . to $1316_{1n}$ and $1316_{2n}$ for cell (n). The plurality of pairs of third delay units generate pairs of fourth match signals m1DDD(0), m2DDD(0) to m1DDD(n), m2DDD(n), i.e. which are delayed three times compared to the pairs of first match signals m1(0), m2(0) to m1(n), m2(n).

The apparatus 1301 also comprises an AND-MUX logic stage, which is controlled by a pair of control signals comprising a first control signal A1 and a second control signal A2.

A detailed description of this aspect of FIG. 13a will be made in conjunction with FIG. 13b, which shows in greater detail the delay units and AND-MUX circuitry used at one cell, for example, cell "x", and it will be appreciated that similar circuitry is found on other cells 0 to n of the apparatus 1301.

A first plurality of AND gates $1321_{10}$ to $1321_{1n}$ are provided ($1321_{1x}$ shown in FIG. 13b), each AND gate $1321_{10}$ to $1321_{1n}$ coupled to receive a corresponding fourth match signal m1DDD(0) to m1DDD(n) on a respective first input. For example, AND gate $1321_{1x}$ receives fourth match signal m1DDD(x), which is output form the delay unit $1316_{1x}$. Each of the first plurality of AND gates $1321_{10}$ to $1321_{1n}$ is coupled to receive on its second input a sequence signal from a preceding cell (i.e. sequence signal s2(x−1) from cell x−1), and whereby the sequence signal relates to that of the other byte of the pair of bytes in the 2-byte cycle. For example, the AND gate $1321_{1x}$ will be coupled to receive the signal s2(x−1) as its second input. The first AND gate $1321_{10}$ of FIG. 13a is coupled to receive the sequence signal s2(n) of the last memory location $1305_n$ in the history buffer 1303, thus forming a "circular" arrangement. For example, for a 1024 element history buffer, sequence signal s2(1023) will be coupled to the second input of AND gate $1321_{10}$, the sequence signal s2(n) thereby being the effective "preceding" sequence signal s2(x−1).

A second plurality of AND gates $1319_{10}$ to $1319_{1n}$ are provided ($1319_{1x}$ shown in FIG. 13b), each AND gate $1319_{10}$ to $1319_{1n}$ coupled to receive a corresponding fourth match signal m1DDD(0) to m1DDD(n) on a respective first input (i.e. three-times-delayed). For example AND gate $1319_{1x}$ is coupled to receive third match signal M1DDD(x) on its first input. Each of the second plurality of AND gates $1319_{10}$ to $1319_{1n}$ is coupled to receive on its second input a corresponding fourth match signal m2DDD(0) to m2DDD(n), i.e. from a succeeding cell location (i.e. cell location (x+1)), and from the other byte of the pair of bytes in the 2-byte cycle. For example, AND gate $1319_{1x}$ is coupled to receive on its second input the fourth match signal m2DDD(x+1).

Figure 13B:
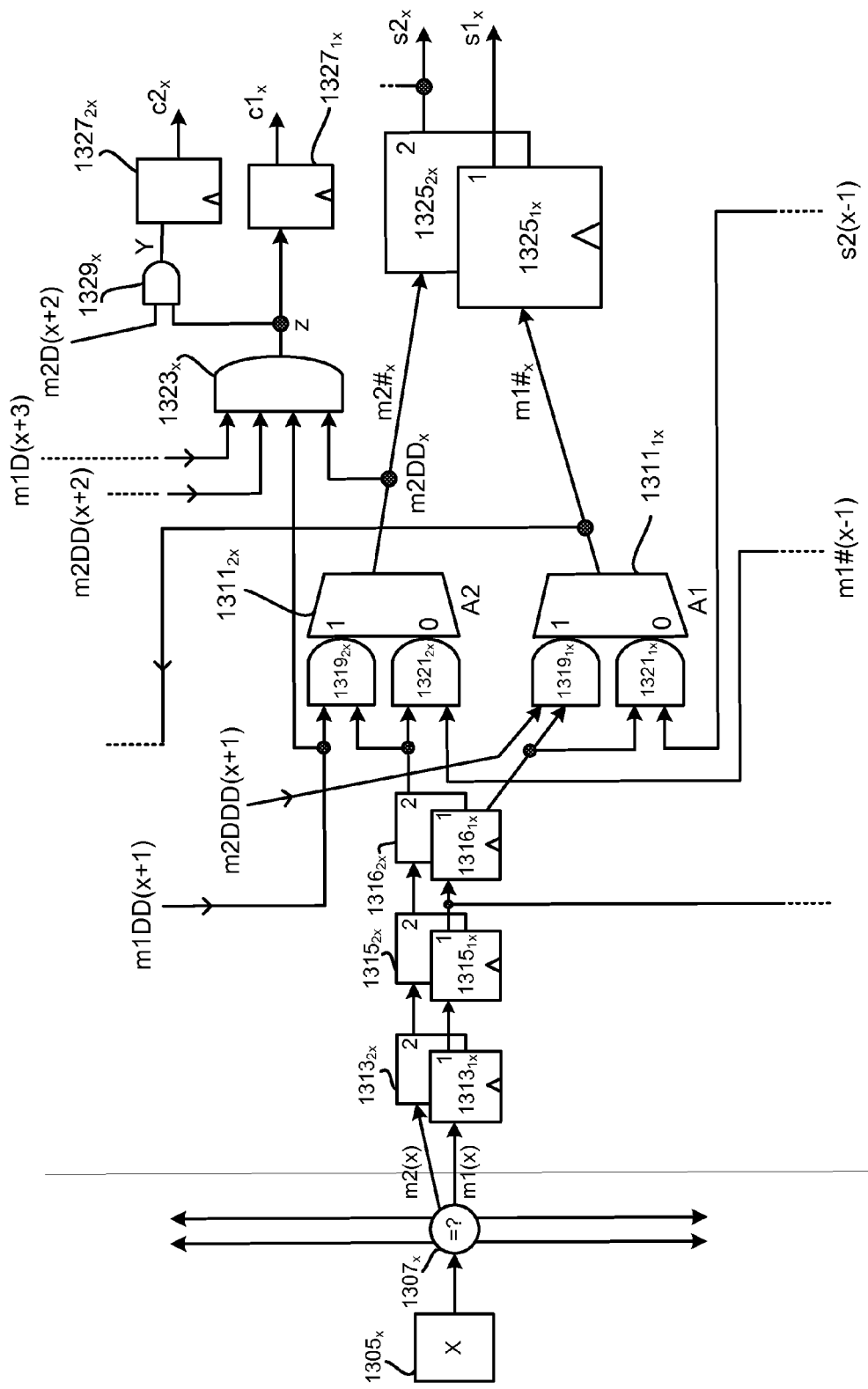

The apparatus 1301 further comprises a plurality of multiplexer units $1311_{10}$ to $1311_{1n}$ ($1311_{1x}$ being shown in FIG. 13b). Each multiplexer unit $1311_{10}$ to $1311_{1n}$ is coupled to receive the output of a corresponding AND gate $1319_{10}$ to $1319_{1n}$ on a first input, and an output from a corresponding AND gate $1321_{10}$ to $1321_{1n}$ on a second input. Each multiplexer unit $1311_{10}$ to $1311_{1n}$ is controlled by a control signal A1, and in the example passes the output from a respective AND gate $1319_{10}$ to $1319_{1n}$ when the control signal A1 is at 1, and the output of a respective AND gates $1321_{10}$ to $1321_{1n}$ when the control signal A1 is at 0.

Each multiplexer unit $1311_{10}$ to $1311_{1n}$ outputs a respective match signal m1#(0) to m1#(n) to a corresponding one of a plurality of fourth delay units $1325_{10}$ to $1325_{1n}$, which in turn outputs a corresponding sequence signal s1(0) to s1(n). FIG. 13b shows multiplexer unit $1311_{1x}$ outputting a respective match signal m1#x to a corresponding fourth delay unit $1325_{1x}$, which in turn outputs a corresponding sequence signal s1x.

A third plurality of AND gates $1319_{20}$ to $1319_{2n}$ are provided ($1319_{2x}$ shown in FIG. 13b), each AND gate $1319_{20}$ to $1319_{2n}$ coupled to receive a corresponding fourth match signal m2DDD(0) to m2DDD(n) on a respective first input. For example, the AND gate $1319_{2x}$ is coupled to receive the fourth match signal m2DDD(x). Each of the AND gates $1319_{20}$ to $1319_{2n}$ is coupled to receive on its second input a third match signal m1DD(0) to m1DD(n) from a succeeding cell (i.e. cell x+1), and whereby the match signal relates to that of the other byte in the pair of bytes of the 2-byte cycle. In other words, AND gate $1319_{2x}$ will be coupled to receive the third match signal m1DD(x+1) as its second input.

A fourth plurality of AND gates $1321_{20}$ to $1321_{2n}$ are provided ($1321_{2x}$ being shown in FIG. 13b), each AND gate $1321_{20}$ to $1321_{2n}$ coupled to receive a corresponding fourth match signal m2DDD(0) to m2DDD(n) on a respective first input. For example, AND gate $1321_{2x}$ is coupled to receive the fourth match signal m2DDD(x) as its first input. Each of the fourth plurality of AND gates $1321_{20}$ to $1321_{2n}$ is coupled to receive on its second input the output of the multiplexer unit $1311_{1(x-1)}$ of a preceding cell, and relating to the other byte of the pair of bytes in the 2-byte cycle, i.e. the output m1#(x−1). In other words, AND gate $1321_{2x}$ is coupled to receive the output m1#(x−1) from multiplexer unit $1311_{1(x-1)}$ (not shown in FIG. 13b).

The apparatus 1301 further comprises a plurality of multiplexer units $1311_{20}$ to $1311_{2n}$ ($1311_{2x}$ being shown in FIG. 13b) Each multiplexer unit $1311_{20}$ to $1311_{2n}$ is coupled to receive the output from a corresponding one of the plurality of AND gates $1319_{20}$ to $1319_{2n}$ on a first input, and an output from a corresponding one of the plurality of AND gates $1321_{20}$ to $1321_{2n}$ on a second input. Each multiplexer unit $1311_{20}$ to $1311_{2n}$ is controlled by a control signal A2, and in the example passes the output from a respective one of the plurality of AND gates $1319_{20}$ to $1319_{2n}$ when the control signal A2 is at 1, and the output of a respective one of the plurality of AND gates $1321_{20}$ to $1321_{2n}$ when the control signal A2 is at 0.

Each multiplexer unit $1311_{20}$ to $1311_{2n}$ outputs a respective match signal m2#(0) to m2#(n) to a corresponding one of a plurality of fourth delay units $1325_{20}$ to $1325_{2n}$, which in turn outputs a corresponding sequence signal s2(0) to s2(n). In the cell shown in FIG. 13b, multiplexer unit $1311_{2x}$ outputs a respective match signal m2#x to a fourth delay unit $1325_{2x}$, which in turn outputs a corresponding sequence signal s2x.

The apparatus 1301 further comprises a plurality of AND gates $1323_1$ to $1323_n$ ($1323_x$ being shown in FIG. 13b). Each AND gate $1323_1$ to $1323_n$ is coupled to receive:

on a first input, the output of the corresponding multiplexer unit $1311_{20}$ to $1311_{2n}$, i.e. signal m2#(0) to m2#(1). For example, the AND gate $1323_x$ receives the signal m2#(x) as a first input;

on a second input, a third match signal m1DD(0) to m1DD(n) from a succeeding memory location (x+1). For example AND gate $1323_x$ receives the second match signal m1DD(x+1) on its second input;

on a third input, a third match signal m2DD(0) to m1DD(n) from a succeeding next-but-one memory location (x+2), and from the other byte of the pair of bytes in the 2-bytes/cycle. For example AND gate $1323_x$ receives the third match signal m2DD(x+2) on its third input;

on a fourth input, a second match signal m1D(0) to m1D(n) from a next-but-two memory location (x+3). For example AND gate $1323_x$ receives the second match signal m1D(x+3) on its fourth input.

A plurality of delay units $1327_{10}$ to $1327_{1n}$ are provided ($1327_{1x}$ shown in FIG. 13b), each coupled to receive the output of a corresponding AND gate $1323_1$ to $1323_n$, and output a continuation signal c1(0) to c1(n). For example, delay unit $1327_{1x}$ of FIG. 13b is coupled to receive the output of AND gate $1323_x$, and output a continuation signal c1x.

A plurality of delay units $1327_{20}$ to $1327_{2n}$ are provided ($1327_{2x}$ shown in FIG. 13b), each coupled to receive the output of a corresponding AND gate $1323_1$ to $1323_n$, via a corresponding AND gate $1329_0$ to $1329_n$, and output a continuation signal c2(0) to c2(n). For example, delay unit $1327_{2x}$ of FIG. 13b is coupled to receive the output of AND gate $1323x$, via AND gate $1329_x$, and output a continuation signal c2x.

The implementation described in FIGS. 13a and 13b ensure that the circuit either fans-out from control signals A1 and A2 to all rows (terminating at a number of D-types in the row, with the creation of various status flags from each row (or a combination of rows) which then all get OR'd together to be used for the control logic for the control signals A1 and A2, i.e. fan-in.

The implementation benefits from having concurrent fan-in/fan-out paths.

From FIGS. 13a and 13b is can be seen that there are two data-to-match inputs (d2m1 and d2m2). In the example the input d2m1 is considered ahead of d2m2. Therefore, a match with d2m1 has precedence over a match with d2m2. It will be appreciated, however, that an implementation could also be configured to consider the data in the other order. The data on d2m1 and d2m2 is matched against every valid entry in the history buffer to create a pair of first match signals (or flags): m1 is set when d2m1 matches; m2 is set when d2m2 matches.

The pair of first match signals m1, m2 are pipelined to generate a pair of second match signals m1D, m2D, a pair of third match signals m1DD, m2DD and a pair of fourth match signals m1DDD, m2DDD.

The implementation of FIGS. 13a and 13b will now be explained further in relation to the following example. Suppose the history buffer 1303 contains:

| Location | | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| Contents | A | B | C | D | E | F | G | B | C | D | K | L | M |

Figure 14:
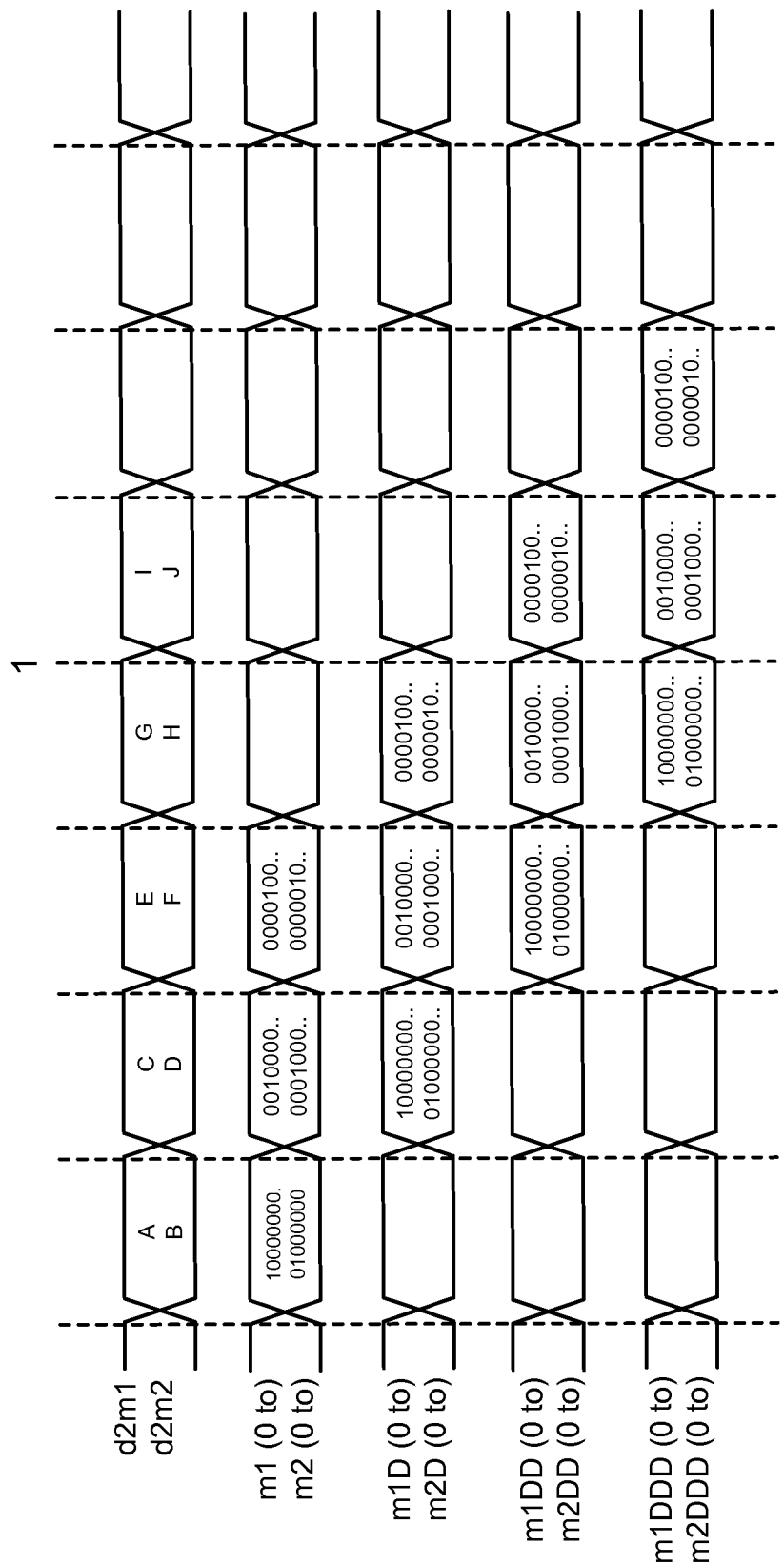
FIG. 14 shows timing diagrams relating to the operation of the circuit shown in FIG. 13 in response to an example of a first input sequence.

1. Suppose that d2m1=A and d2m2=B.
   Then m1(0) will be set and m2(1) will be set.
2. On the next cycle, suppose we present C and D:
   Then m1(2) will be set and m2(3) will be set, and so on.
   FIG. 14 shows this in operation:
   The bit-streams represents bits 0 (left-most) and upwards (right-most)
   On the rising edge of the clock marked 1, it can be seen that m1DDD(0) and m2DDD(1) are presented to the AND-MUX sequence system.

Hence, it is possible to determine that two bytes have matched.

It is also possible to determine, using m1DD and m2DD that 2 more bytes have matched, and further determine using m1D and m2D, that yet two more bytes have matched. In this way, it is possible to predict that a 6-byte match sequence is being received.

It should be seen that in general, for a cell X, when match signal m1DDD$_x$ indicates that a match is present, and the circuit progressively ANDs with:

m2DDD$_{X+1}$ would indicate a 2-byte sequence, starting at location X m1DD$_{X+2}$ would indicate a 3-byte sequence, starting at location X m2DD$_{X+3}$ would indicate a 4-byte sequence, starting at location X m1D$_{X+4}$ would indicate a 5-byte sequence, starting at location X m2D$_{X+5}$ would indicate a 6-byte sequence, starting at location X Next will be described how the AND-MUX system comprising AND gates 1319, 1321 and multiplexer units 1311 feeds into the sequence registers 1325.

If it is considered that the control signal A1 is at 1, then a new 2-byte sequence is allowed to enter the sequence register (i.e. based on the fourth match signal m1DDD$_X$ being ANDed with m2DDD$_{X+1}$).

However, with the control signal A1 at 0, then only a sequence that propagates from the cell below will be allowed to continue. In this case, from the cell below is the output of the sequence register of a preceding cell.

If it is considered that the control signal A2 is at 1, then a new 2-byte sequence is allowed to enter the sequence register (i.e. based on the fourth match signal m2DDD$_X$ being ANDed with the third match signal m1DD$_{X+1}$).

However, with the control signal A2 at 0, then only a sequence that propagates from the cell below is allowed to continue. In this case, from the cell below is the combinatorially derived m1# signal. The reason for this can be seen from a simple example described below.

Suppose that no match sequences have been detected for some time, and then A B match (in the same cycle). As will be seen below, the control signals A1 and A2 will be at 1 and 0, respectively, meaning that first match signals m1# are allowed to enter the sequence register, but any first match signals m2# must be propagated from below.

In view of the fact that the first control signal A1 is at 1, then it can be seen that sequence signal s1$_X$ will get set to 1. Simultaneously, with the control signal A2 at 0, then the sequence signal s2$_{X+1}$ will be set to 1 where there is a propagating sequence from below, which must be m1.

The output of the sequence registers $1325_{10}$ to $1325_{1n}$ (the s1 registers) and the output of the sequence registers $1325_{20}$ to $1325_{2n}$ (the s2 registers) are the primary output of the matching system.

In the implementation of FIGS. 13a and 13b, only sequences of 2-or-more bytes become loaded. Also, in a similar manner to the signals d2m1 and d2m2, the sequence signal s1 indicates matching on the earlier byte, while sequence signal s2 indicates matching on the later byte. It will be appreciated however, that the implementation is not limited to this order of performing the 2-bytes per cycle, and that the d2m2 and s2 signals may be processed before the d2m1 and s1 signals, if desired.

The table shown in FIG. 15 indicates an example of sequence 1 and sequence 2 patterns.

It will be appreciated that the arrangements of FIGS. 13a and 13b enables sequences to start/end on any byte boundary, which means that one sequence can end and another start, all in the same cycle.

Next will be provided a more detailed description of the AND gates and OR gates in the implementation of FIGS. 13a and 13b.

First, consider point Z in FIG. 13b, being the output of each respective AND gate 1323(0) to 1323(n), for example AND gate 1323x in FIG. 13b. If the circuit is about to set a bit in sequence 2 (m2# is set), then the signal at point Z indicates whether or not there are 3 more bytes that match (i.e. a 4-byte or more sequence). This point of the circuit is therefore looking ahead not just into the next cycle, but the cycle after that and considering the first byte of that cycle.

Now consider point Y in FIG. 13b, which is looking to see if there are 4 more bytes that match (a 5-byte or more sequence). As above, this point is also looking at the second byte 2 cycles ahead.

Both Z and Y become registered as continuation signals c1x and c2x, so that the results are available later on, as will be described later. The entire c1 and c2 buses are OR'd together using the OR gates 1332 and 1333, respectively, shown in FIG. 13a, to generate first and second continuation control signals c1_OR and c2_OR.

Figure 13C:
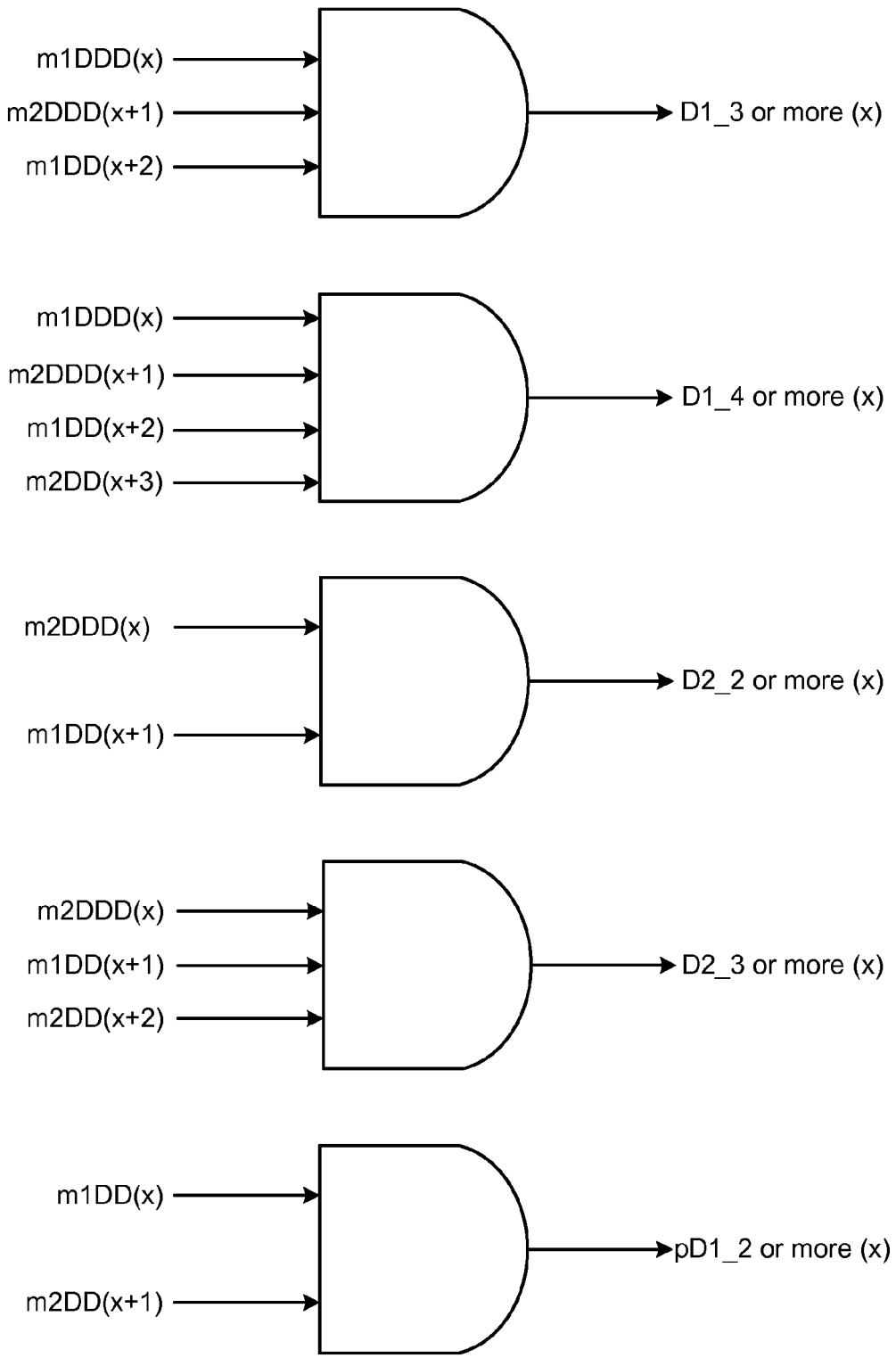

Referring to FIG. 13c, the implementation shown in FIGS. 13a and 13 may also generate (combinatorially) the following signals:

Control signal D1_3ormore(x)<=m1DDD(x) AND m2DDD(x+1) AND m1DD(x+2);

This control signal "D1_3ormore(x)" indicates a 3-byte sequence starting at byte 1, and relating to the earlier of the two bytes in the pair of the 2-byte/cycle.

Signal D1_4ormore(x)<=m1DDD(x) AND m2DDD(x+1) AND m1DD(x+2) AND m2DD(x+3);

This signal "D1_4ormore(x)" indicates a 4-byte sequence starting at byte 1, and relating to the earlier of the two bytes in the pair of the 2-bytes/cycle.

Signal D2_2ormore(x)<=m2DDD(x) AND m1DD(x+1);

This signal "D2_2ormore(x)" indicates a 2-byte sequence starting at byte 2, and relating to the latter of the two bytes in the pair of the 2-bytes/cycle.

Signal D2_3ormore(x)<=m2DDD(x) AND m1DD(x+1) AND m2DD(x+2);

This signal "D2_3ormore(x)" indicates a 3-byte sequence starting at byte 2, and relating to the latter of the two bytes in the pair of the 2-bytes/cycle.

Signal pD1_2ormore(x)<=m1DD(x) AND m2DD(x+1);

This signal "pD1_2ormore(x)" provides an advanced indication that there will be a 2-or-more byte sequence starting on byte-1.

Figure 13D:
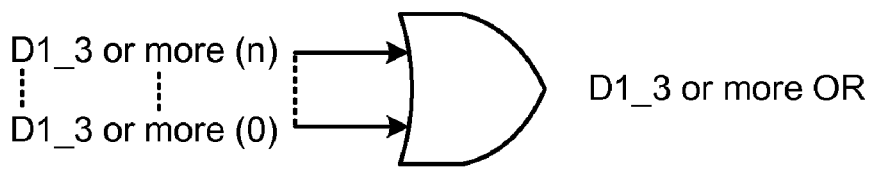
Figure 13D:
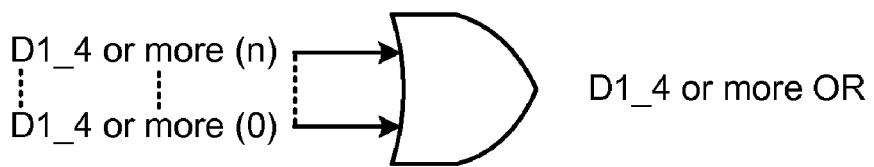
Figure 13D:
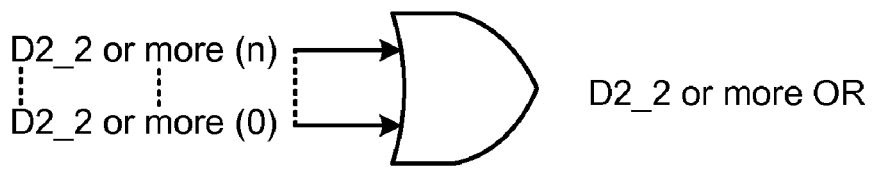
Figure 13D:
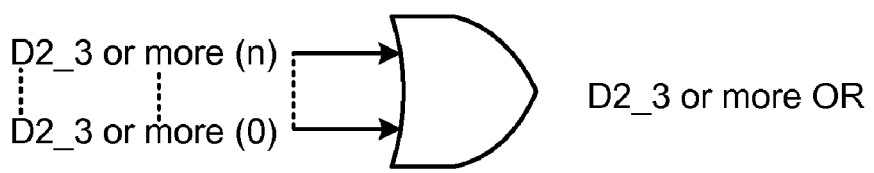
Figure 13D:
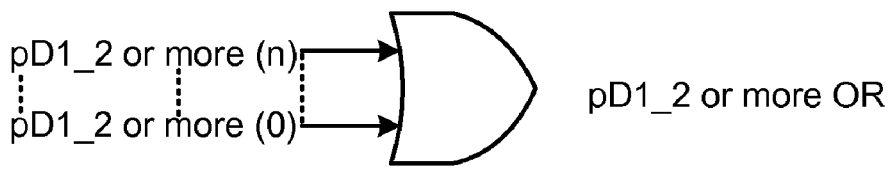

Referring to FIG. 13d, the signals generated above can also all be OR'd together (combinatorially) to provide control signals D1_3ormoreOR, D1_4ormoreOR, D2_2ormoreOR, D2_3ormoreOR and pD1_2ormoreOR.

It is noted that the combinatorial control signals D1_3ormoreOR, D1_4ormoreOR, D2_2ormoreOR and D2_3ormoreOR provide information about the nature of the m1DDD and m2DDD values. That is, suppose m1DDD(5) is at 1. At the same time, the circuit can look at D1_3ormore(5) to determine if this is a 3-or-more byte match and D1_4ormore(5) to determine if this is a 4-or-more byte match.

Next will be described the generation of the first control signal A1 and second control signal A2 of the implementation of FIG. 13a, which lies at the heart of the compression engine.

A state-machine as described below is provided for generating the first and second control signals A1, A2, which represent a state-vector. The state-machine uses the OR of all the status-flags (i.e. as shown in FIG. 13d) to decide when to allow new sequences to start and when to force sequences to propagate.

The state machine for controlling the status of the first and second control signals A1 (Allow1) and A2 (Allow2) is shown below, and uses the flags shown and described in FIGS. 13c and 13d:

```
state := Allow1 & Allow2;
case state is
    when "11"  =>   if (D2_3ormoreOR = '1')
                    then Allow1 <= '0'; Allow2 <= '0';
                    MatchCount <=
                    CONV_STD_LOGIC_VECTOR(1, 9);
                    elsif (D2_2ormoreOR = '1')
                    then Allow1 <= '0'; Allow2 <= '1';
                    elsif (pD1_2ormoreOR = '1')
                    then Allow1 <= '1'; Allow2 <= '0';
                    end if;
    when "10"  =>   if (D1_4ormoreOR = '1')
                    then Allow1 <= '0'; Allow2 <= '0';
                    MatchCount <=
                    CONV_STD_LOGIC_VECTOR(2, 9);
                    elsif ( D1_3ormoreOR = '1')
                    then Allow1 <= '0'; Allow2 <= '1';
                    elsif (pD1_2ormoreOR = '1')
                    then Allow1 <= '1'; Allow2 <= '0';
                    else Allow1 <= '1'; Allow2 <= '1';
                    end if;
    when "01"  =>   if (D2_3ormoreOR = '1')
                    then Allow1 <= '0'; Allow2 <= '0';
                    MatchCount <=
                    CONV_STD_LOGIC_VECTOR(1, 9);
                    elsif ( D2_2ormoreOR = '1')
                    then Allow1 <= '0'; Allow2 <= '1';
                    elsif (pD1_2ormoreOR = '1')
                    then Allow1 <= '1'; Allow2 <= '0';
                    else Allow1 <= '1'; Allow2 <= '1';
                    end if;
    when "00"  =>   v_c1_OR := c1_OR;
                    v_c2_OR := c2_OR;
                    if MatchCount =
                    MAX_MATCH_LENGTH-2)
                    then v_c1_OR := '0'; v_c2_OR := '0';
                    elsif (MatchCount = MAX_MATCH_LENGTH-3)
                    then v_c2_OR := '0';
                    end if;
                    if (v_c2_OR = '1')
                    then Allow1 <= '0'; Allow2 <= '0';
                    MatchCount <= MatchCount + 2;
                    elsif (v_c1_OR = '1')
                    then Allow1 <= '0'; Allow2 <= '1';
                    elsif (pD1_2ormoreOR = '1')
                    then Allow1 <= '1'; Allow2 <= '0';
                    else Allow1 <= '1'; Allow2 <= '1';
                    end if;
    when OTHERS => null;
end case;
```

In the example shown in the implementation of FIG. 13a, the circuit is configured such that it starts with each of the first and second control signals A1, A2 set to 1. This means that there are no sequences in progress and that a new sequence can be started when one arrives. As will be seen from the state machine, in reality, in the state whereby both the first and second control signals A1, A2 are at 11, the circuit can only start a sequence that starts on byte 2. However, for a sequence that starts on byte 1, advance notice of this can be obtained to change state to 10, i.e. the first control signal A1 at 1 and the second control signal A2 at 0, which will allow sequences to start on byte 1 but only allow propagated sequences with byte 2.

The implementations described above have the advantage of enabling fan-in and fan-out to be performed concurrently (or in parallel) during a clock cycle, which avoids the disadvantages associated with having a sequential or cascaded fan-in and fan-out operation during a clock cycle.

As noted above, although the various implementations are described in relation to a CAM having a history buffer, it is noted that the implementations may be used with any buffer memory having a set of storage locations that are capable of receiving data that is to be matched, and that are capable of generating corresponding match flags.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A method for performing adaptive lossless data compression using a buffer memory, the method comprising the steps of:
   receiving a plurality of first match signals (m(0) to m(n)), each first match signal indicating whether a byte of an input sequence matches a byte in a memory location of the buffer memory;
   generating a plurality of second match signals (mD(0) to mD(n)), wherein a second match signal (mD) is a delayed version of a corresponding first match signal (m); and
   using the second match signals (mD(0) to mD(n)) to detect a match sequence between the data bytes received in the input sequence and the data bytes stored in the buffer memory, and using the first match signals (m(0) to m(n)) to predict whether the match sequence continues during a subsequent byte of the input sequence.

2. A method as claimed in claim 1, wherein the step of predicting whether a match sequence continues comprises the step of generating one or more continuation signals c(0) to c(n), wherein the continuation signals c(0) to c(n) are used to control whether an overlapping subsequent sequence is allowed to start.

3. A method as claimed in claim 2, wherein the step of generating a continuation signal for a particular memory location (x) comprises the steps of determining a sequence continuation using a second match signal (MD(x)) from the current location and a first match signal (m(x+1)) from a succeeding memory location.

4. A method as claimed in claim 1, further comprising the step of generating a plurality of third match signals (mDD(0) to mDD(n)), wherein a third match signal (MDD) is a delayed version of a corresponding second match signal (MD).

5. A method as claimed in claim 4, further comprising the step of using the plurality of third match signals (mDD(0) to mDD(n)) to generate a plurality of 2-byte detection signals (D(0) to D(n)), wherein a 2-byte detection signal indicates the presence of a minimum 2-byte sequence ahead.

6. A method as claimed in claim 5, further comprising the step of generating a plurality of continuation signals (c(0) to c(n)), wherein each continuation signal is derived based on a third match signal (mDD(x)) from a current cell location (x), a second match signal (mD(x+1)) from a succeeding cell location (x+1), and a first match signal (m(x+2)) from a next-but-one succeeding memory location (x+2), wherein the plurality of continuation signals (c(0) to c(n)) indicate the presence of a minimum 3-byte sequence ahead.

7. A method as claimed in claim 6, further comprising the step of using the plurality of 2-byte detection signals (D(0) to D(n)) and the plurality of continuation signals (c(0) to c(n)) to generate a control signal (A), the control signal (A) controlling whether the matching of a new sequence can commence.

8. A method as claimed in claim 7, wherein the plurality of 2-byte detection signals (D(0) to D(n)) and plurality of continuation signals (c(0) to c(n)) enable a match status of each memory location to be fanned-in concurrently with the fanning-out of the control signal A.

9. A method as claimed in claim 7, wherein pairs of first match signals (m1, m2) are received from a 2-byte per cycle CAM based ALDC scheme, and further comprising the step of generating pairs of second match signals, third match signals and fourth match signals, and using the first, second, third and fourth match signals to detect 2+, 3+, 4+ and 5+ byte sequences.

10. An apparatus for performing adaptive lossless data compression using a buffer memory, wherein the apparatus receives a plurality of first match signals (m(0) to m(n)), each first match signal indicating whether a byte of an input sequence matches a byte in a memory location of the buffer memory, the apparatus comprising:
    a plurality of delay units for generating a plurality of second match signals (mD(0) to mD(n)), wherein a second match signal (mD) is a delayed version of a corresponding first match signal (m);
    sequence detection logic configured to detect a matching sequence using the second match signals (mD(0) to mD(n)); and
    sequence continuation logic configured to determine, using the first match signals (m(0) to m(n)), whether a matching sequence continues in a subsequent byte of the input sequence.

11. An apparatus as claimed in claim 10, wherein the sequence continuation logic is configured to generate one or more continuation signals (c(0) to c(n)), wherein the continuation signals (c(0) to c(n)) are used to control whether a new matching sequence is allowed to start.

12. An apparatus as claimed in claim 11, wherein the sequence continuation logic for a particular memory location (x) is configured to receive a second match signal (MD(x)) relating to the current memory location and a first match signal (m(x+1)) relating to a succeeding memory location, and generate a continuation signal for that particular memory location (x).

13. An apparatus as claimed in claim 10, further comprising a plurality of delay units configured to generate a plurality of third match signals (mDD(0) to mDD(n)), wherein a third match signal (MDD) is a delayed version of a corresponding second match signal (MD).

14. An apparatus as claimed in claim 13, further comprising 2-byte detection logic coupled to receive the plurality of third match signals (mDD(0) to mDD(n)), and output a plurality of 2-byte detection signals (D(0) to D(n)) indicating the presence of a minimum 2-byte sequence ahead.

15. An apparatus as claimed in claim 14, wherein the sequence continuation logic for a particular memory location (x) is configured to receive a third match signal (mDD(x)) from a current cell location (x), a second match signal (mD(x+1)) from a succeeding cell location (x+1), and a first match signal (m(x+2)) from a next-but-one succeeding memory location (x+2), and generate a continuation signal (c(x)) indicating the presence of a minimum 3-byte sequence ahead.

16. An apparatus as claimed in claim 15, wherein the 2-byte detection logic and sequence continuation logic are configured to generate a control signal (A), the control signal (A) controlling whether the sequence detection logic is allowed to commence matching a new sequence.

17. An apparatus as claimed in claim 16, wherein the apparatus is configured to use the plurality of 2-byte detection signals (D(0) to D(n)) and plurality of continuation signals (c(0) to c(n)) to enable a match status of each memory location to be fanned-in concurrently with the fanning-out of the control signal A.

18. An apparatus as claimed in claim 16, wherein the apparatus is configured to receive pairs of first match signals (m1, m2) corresponding to a 2-byte per cycle CAM based ALDC scheme, the apparatus being further adapted to generate pairs of second match signals, third match signals and fourth match signals, and use the first, second, third and fourth match signals to detect minimum byte sequences of 2 bytes, 3 bytes, 4 bytes and 5 bytes.

* * * * *